(12) United States Patent
Sharma et al.

(10) Patent No.: US 9,431,211 B2
(45) Date of Patent: Aug. 30, 2016

(54) HYBRID ELECTRON MICROSCOPE

(71) Applicant: NATIONAL INSTITUTE OF STANDARDS AND TECHNOLOGY, Gaithersburg, MD (US)

(72) Inventors: Renu Sharma, Gaithersburg, MD (US); Stefano Mazzucco, Cambridge (GB)

(73) Assignees: THE UNITED STATES OF AMERICA, AS REPRESENTED BY THE SECRETARY OF COMMERCE, Washington, DC (US); UNIVERSITY OF MARYLAND, COLLEGE PARK, College Park, MD (US)

(*) Notice: Subject to any disclaimer, the term of this patent is extended or adjusted under 35 U.S.C. 154(b) by 0 days.

(21) Appl. No.: 14/827,666

(22) Filed: Aug. 17, 2015

(65) Prior Publication Data

US 2016/0027609 A1   Jan. 28, 2016

Related U.S. Application Data

(60) Provisional application No. 62/040,478, filed on Aug. 22, 2014.

(51) Int. Cl.
| | |
|---|---|
| H01J 37/28 | (2006.01) |
| G01N 21/64 | (2006.01) |
| H01J 37/22 | (2006.01) |
| H01J 37/20 | (2006.01) |
| H01J 37/26 | (2006.01) |

(52) U.S. Cl.
CPC .............. *H01J 37/226* (2013.01); *H01J 37/20* (2013.01); *H01J 37/261* (2013.01); *H01J 2237/063* (2013.01); *H01J 2237/2007* (2013.01); *H01J 2237/2602* (2013.01)

(58) Field of Classification Search
CPC ...... H01J 37/228; H01J 37/28; H01J 37/256; H01J 37/258; G01N 21/6428; G01N 21/6458; G01N 21/002; G01N 6/10
USPC ......... 250/310, 306, 307, 311, 492.24, 493.1
See application file for complete search history.

(56) References Cited

U.S. PATENT DOCUMENTS 4,149,074 A * 4/1979 Schliepe .................. G02B 6/04
250/311

(Continued)

*Primary Examiner* — David A Vanore
(74) *Attorney, Agent, or Firm* — Toby D. Hain

(57) ABSTRACT

A hybrid electron microscope includes: an electron source to emit an electron beam; a parabolic mirror including: a reflective surface; and an aperture to communicate the electron beam through the parabolic mirror; and a sample holder interposed between the electron source and the parabolic mirror such that the reflective surface of the parabolic mirror faces the electron source and the sample holder. A process for acquiring hybrid electron microscopy data includes: disposing a parabolic mirror in a chamber, the parabolic mirror including: a reflective surface; and an aperture to communicate an electron beam through the parabolic mirror; disposing a sample on a sample holder; interposing a sample holder between an electron source and the parabolic mirror such that the reflective surface of the parabolic mirror faces the electron source and the sample holder; producing the electron beam from the electron source; subjecting the sample to the electron beam; communicating the electron beam through the sample and the aperture of the parabolic mirror; and collecting imaging data of the sample in response to the subjecting the sample to the electron beam to acquire the hybrid electron microscopy data.

17 Claims, 25 Drawing Sheets

(56) References Cited

U.S. PATENT DOCUMENTS

| | | | |
|---|---|---|---|
| 7,498,593 B2 * | 3/2009 | Shen | H01Q 3/2676 250/330 |
| 7,589,322 B2 * | 9/2009 | Nishikata | H01J 37/228 250/306 |
| 7,718,979 B2 * | 5/2010 | Knowles | H01J 37/228 250/492.1 |
| 8,319,181 B2 * | 11/2012 | Parker | G01N 21/6428 250/307 |
| 9,040,909 B2 * | 5/2015 | Parker | G01N 21/6428 250/306 |
| 2005/0006582 A1 * | 1/2005 | Steigerwald | H01J 37/05 250/311 |
| 2007/0023655 A1 * | 2/2007 | Nishikata | H01J 37/228 250/310 |
| 2012/0193530 A1 * | 8/2012 | Parker | G01N 21/6428 250/307 |
| 2015/0262784 A1 * | 9/2015 | Hoogenboom | H01J 37/222 250/307 |

* cited by examiner

HYBRID ELECTRON MICROSCOPE

CROSS REFERENCE TO RELATED APPLICATIONS

This application claims the benefit of U.S. Provisional Patent Application Ser. No. 62/040,478 filed Aug. 22, 2014, the disclosure of which is incorporated herein by reference in its entirety.

STATEMENT REGARDING FEDERALLY SPONSORED RESEARCH

This invention was made with United States government support from the National Institute of Standards and Technology. The government has certain rights in the invention.

BRIEF DESCRIPTION

Disclosed is a hybrid electron microscope comprising: an electron source to emit an electron beam; a parabolic mirror comprising: a reflective surface; and an aperture to communicate the electron beam through the parabolic mirror; and a sample holder interposed between the electron source and the parabolic mirror such that the reflective surface of the parabolic mirror faces the electron source and the sample holder.

Further disclosed is a process for making a hybrid electron microscope, the process comprising: disposing an electron source to emit an electron beam in a chamber; disposing a parabolic mirror in the chamber, the parabolic mirror comprising: a reflective surface; and an aperture to communicate the electron beam through the parabolic mirror; and interposing a sample holder between the electron source and the parabolic mirror such that the reflective surface of the parabolic mirror faces the electron source and the sample holder.

Additionally disclosed is a process for acquiring hybrid electron microscopy data, the process comprising: disposing a parabolic mirror in a chamber, the parabolic mirror comprising: a reflective surface; and an aperture to communicate an electron beam through the parabolic mirror; disposing a sample on a sample holder; interposing a sample holder between an electron source and the parabolic mirror such that the reflective surface of the parabolic mirror faces the electron source and the sample holder; producing the electron beam from the electron source; subjecting the sample to the electron beam; communicating the electron beam through the sample and the aperture of the parabolic mirror; and collecting imaging data of the sample in response to the subjecting the sample to the electron beam to acquire the hybrid electron microscopy data.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a hybrid electron microscope herein provides atomic scale resolution for measurement of a nanometer-scale area of a sample from an interaction of an electron beam with the sample under a known temperature of the sample. Further, the hybrid electron microscope also provides spectroscopic information obtained by an interaction of a probe light with the sample under identical conditions independently or simultaneously for direct comparison with the atomic scale resolved measurements. Advantageously, the hybrid electron microscope can be part of a charged particle device such as a transmission electron microscope (TEM), scanning electron microscope (SEM), or variant thereof, e.g., an environmental TEM (ETEM), scanning TEM (STEM), and the like. In such configuration, the hybrid electron microscope provides concurrent acquisition of data on an atomic scale or micro scale portion of the sample. It is contemplated that spectroscopies include Raman spectroscopy, cathodoluminescence, and the like in an ETEM that includes the hybrid electron microscope.

Figure 1:
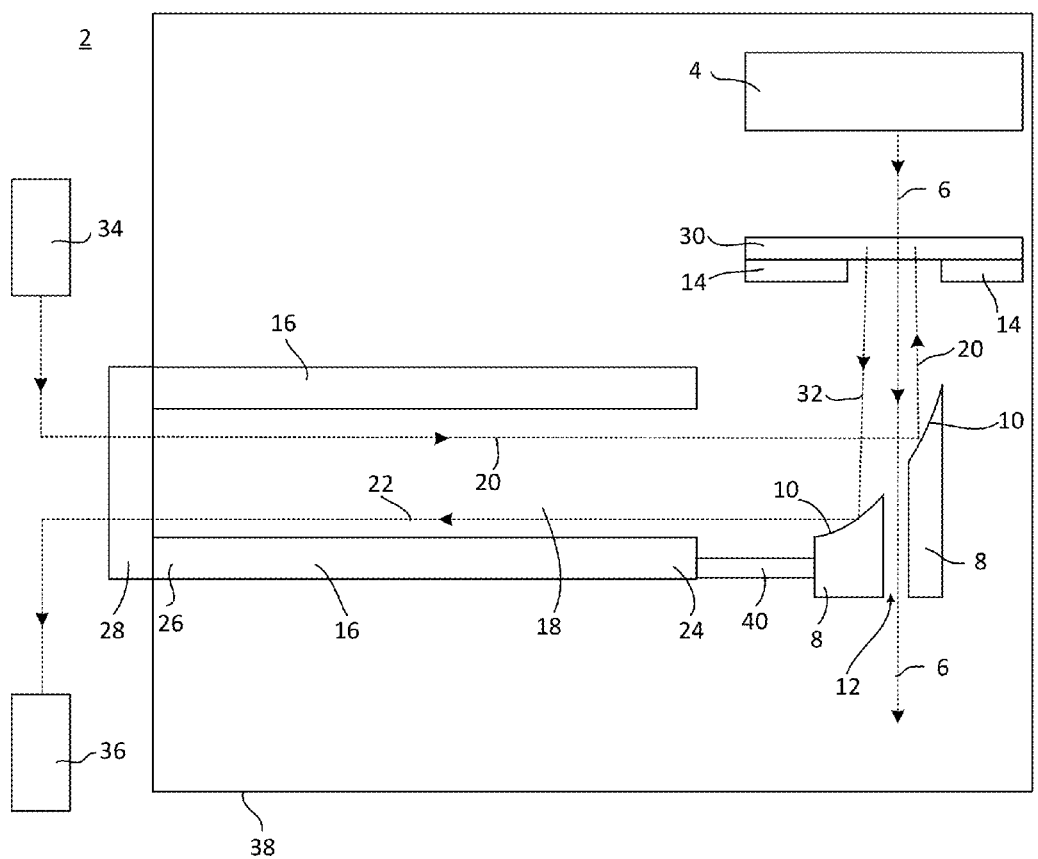
FIG. 1 show a hybrid electron microscope.

In an embodiment, as shown in FIG. 1, hybrid electron microscope 2 includes electron source 4 opposing sample holder 14 and parabolic mirror 8. Sample holder 14 is interposed between electron source 4 and parabolic mirror 8. Electron source 4 is configured to produce electron beam 6 that propagates from electron source 4 toward sample 30 disposed on sample holder 14. Parabolic mirror 8 includes reflective surface 10 facing sample holder 14 and electron source 4 and also includes aperture 12 to communicate electron beam 6 through parabolic mirror 8. Electron source 4, parabolic mirror 8, and sample holder 14 are disposed in vacuum chamber 38. Additionally, parabolic mirror is disposed on armature 16 via coupler 40. Armature 16 includes first end 24 first end disposed proximate to sample holder 14; second end 26 disposed distal to sample holder 14 and parabolic mirror 8. Parabolic mirror 8 is disposed on first end 24 of armature 16, which also includes optical path 18 that extend from first end 24 to second end 26 to communicate probe light 20 and collected light 22 therethrough. That is, armature 16 includes 18 optical path to communicate probe light 20 to reflective surface 10 of parabolic mirror 8 and to communicate collected light 22 from reflective surface 10. Further, hybrid electron microscope 2 can include optical window 28 disposed at second end 26 of armature 16 to receive probe light 20 from light source 34 and to communicate collected light 22 from parabolic mirror 8 to detector 36. In some embodiments, hybrid electron microscope 2 includes detector 36 (e.g., a photodiode, photomultiplier, phosphor screen, CCD camera, or the like) to detect collected light 22.

In a certain embodiment, hybrid electron microscope 2 further includes sample 30 disposed on sample holder 14. Sample 30 receives electron beam 6 from electron source 4; receive probe light 20 reflected from reflective surface 10 of parabolic mirror 8; emits emitted light 32 in response to receipt of electron beam 6, probe light 20, or a combination thereof. Emitted light 32 propagates from sample 30 to reflective surface 10, wherein parabolic mirror 8 reflects emitted light 32 as collected light 22.

Figure 2:
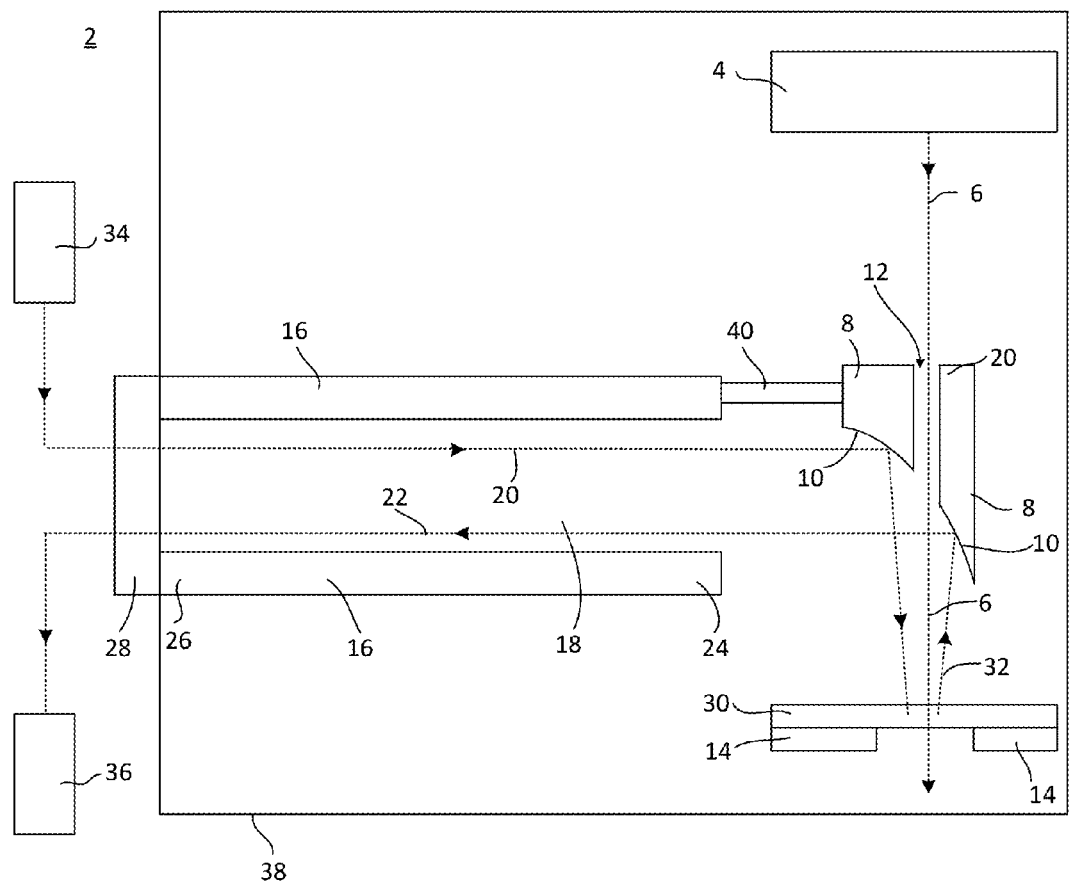
FIG. 2 shows a hybrid electron microscope.

According to an embodiment, as shown in FIG. 2, hybrid electron microscope 2 includes electron source 4 opposing sample holder 14. Here, parabolic mirror 8 is interposed between electron source 4 and sample holder 14. Electron source 4 is configured to produce electron beam 6 that propagates from electron source 4 toward sample 30 disposed on sample holder 14 and through aperture 12 of parabolic mirror 8.

Figure 3A:
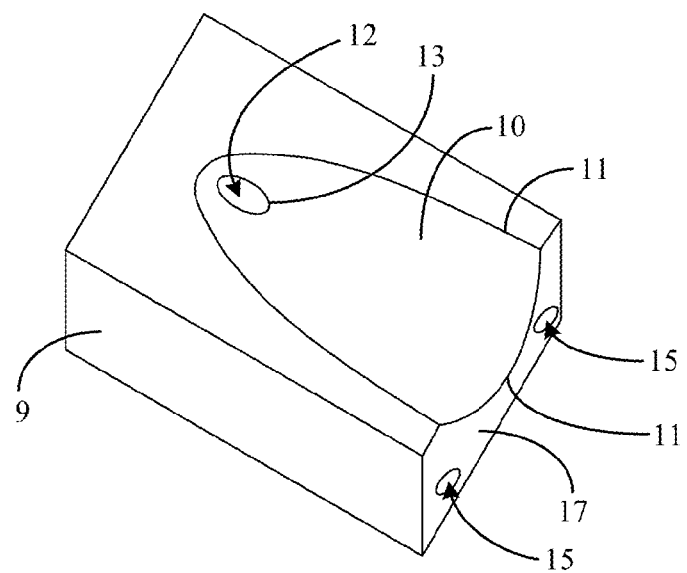
FIG. 3A shows a perspective view of a parabolic mirror.
Figure 3B:
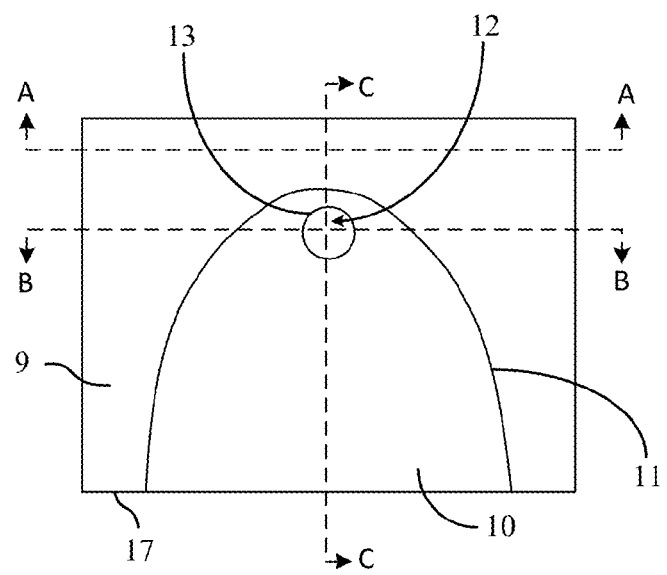
FIG. 3B shows a top view of the parabolic mirror shown in FIG. 3A.
Figure 3C:
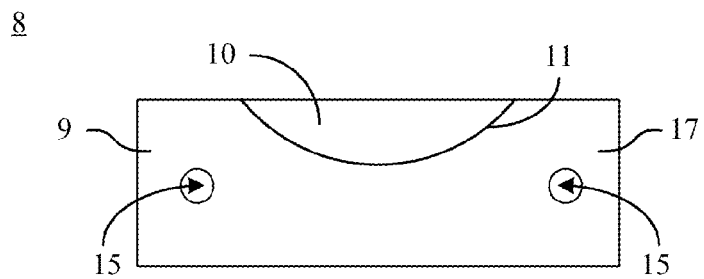
FIG. 3C shows an end view of the parabolic mirror shown in FIG. 3A.
Figure 3D:
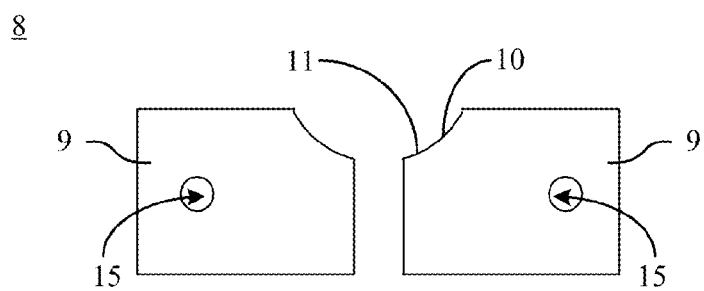
FIG. 3D shows a cross-section along line B-B of the parabolic mirror shown in FIG. 3B.
Figure 3E:
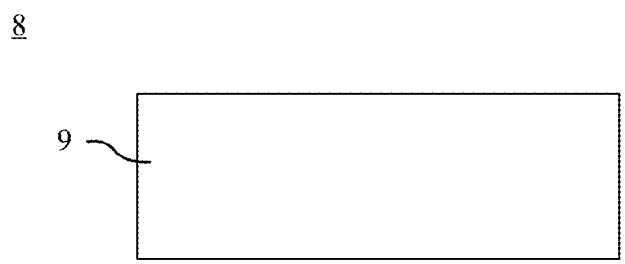
FIG. 3E shows a cross-section along line A-A of the parabolic mirror shown in FIG. 3B.
Figure 3F:
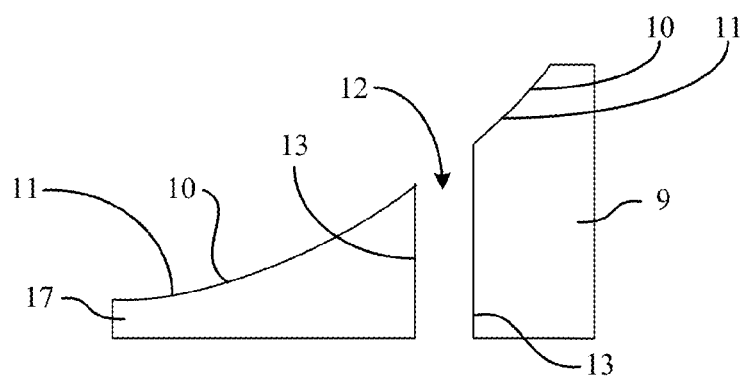
FIG. 3F shows a cross-section along line C-C of the parabolic mirror shown in FIG. 3B.

In an embodiment, with reference to FIG. 3A (a perspective view of parabolic mirror 8), FIG. 3B (a top view of parabolic mirror 8 shown in FIG. 3A), FIG. 3C (end view of parabolic mirror 8 shown in FIG. 3A), FIG. 3D (a cross-section along line B-B of the parabolic mirror shown in FIG. 3A), FIG. 3E (a cross-section along line A-A of parabolic mirror 8 shown in FIG. 3A), FIG. 3F (a cross-section along line C-C of parabolic mirror 8 shown in FIG. 3A), parabolic mirror 8 includes substrate 9 on which reflective surface 10 is disposed. Aperture 12 extends through substrate 9 and is bounded by side wall 13. Reflective surface 10 is bounded by periphery 11 that establishes an interface between reflective surface 10 and a rest of substrate 9. Additionally, parabolic mirror 8 can include mount hole 15 disposed in end 17 to receive coupler 40. It is contemplated that reflective surface 10 has a parabolic curved shape to receive probe light 20 that is communicated through optical path 18 of armature 16. Reflective surface 10 reflects probe light 20 onto sample 30 and selectively focuses probe light 20 onto sample 30 such that probe light 20 has a selected beam diameter (also referred to as spot size) on sample 30. Further, reflective surface 10 receives emitted light 32 from sample 30 and collimates or focuses emitted light 32 as collected light 22 that is reflected from reflective surface and propagates from reflective surface 10 and through optical path 18 of armature 16.

Figure 4A:
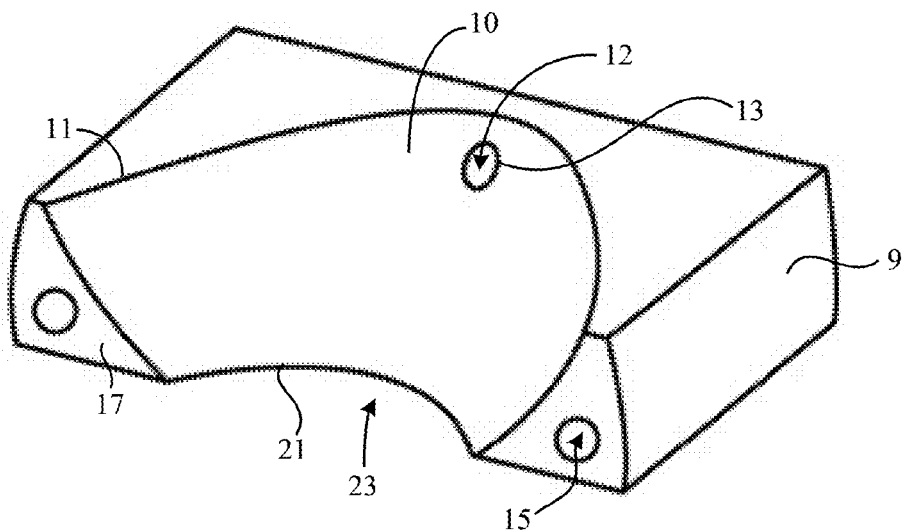
FIG. 4A shows a perspective view of a parabolic mirror.
Figure 4B:
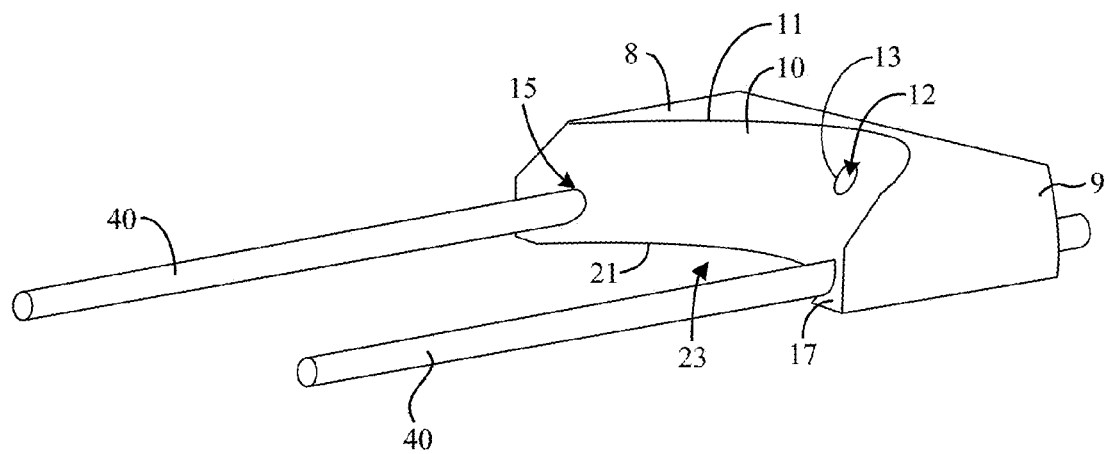
FIG. 4B shows the parabolic mirror shown in FIG. 4A and a plurality of couplers.

In an embodiment, with reference to FIG. 4A and FIG. 4B, parabolic mirror 8 includes second aperture 23 disposed in substrate 9 and bounded by border 21. Second aperture 23 provides for substrate 9 and reflective surface 10 to fit in a small space, e.g., between electron optics in an electron microscope. According to an embodiment, reflective surface 10 can be a portion of a parabolic surface with an upper section removed to reduce a thickness of substrate 9. Moreover, parabolic mirror 8 receives coupler 40 in mount hole 15. Coupler 40 also is received by armature 16 to attach parabolic mirror 8 to armature 16 via coupler 40. Although two couplers 40 are shown in FIG. 4B, any number of couplers can be used such that parabolic mirror 8 is stably attached to armature 16 to prevent vibration of parabolic mirror 8 with respect to sample 30 or sample holder 14. It is contemplated that parabolic mirror 8 can be replaced or polished if a surface reflectivity of reflective surface 10 needs improvement.

Figure 5A:
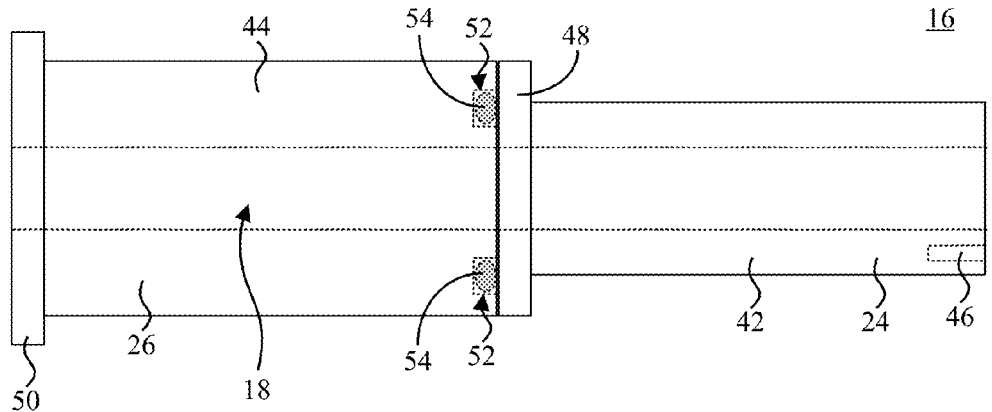
FIG. 5A shows a side view of an armature.
Figure 5B:
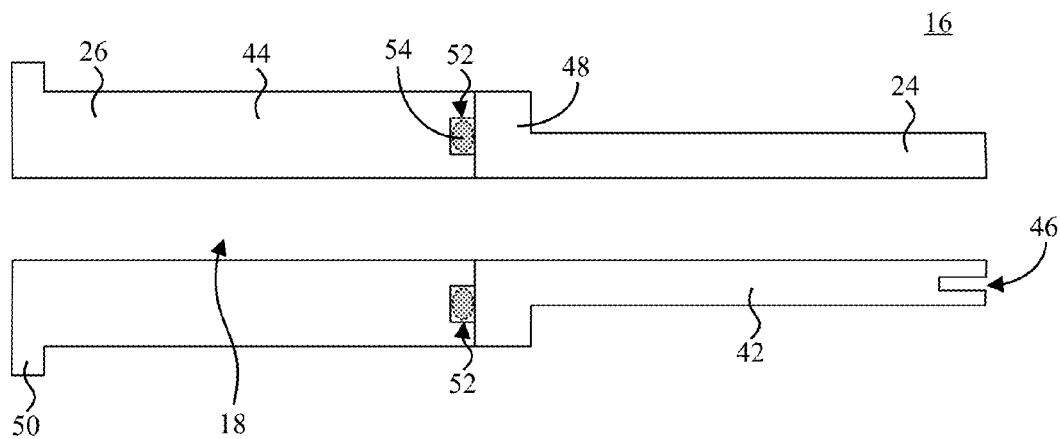
FIG. 5B shows a cross-section of the armature shown in FIG. 5A.
Figure 5C:
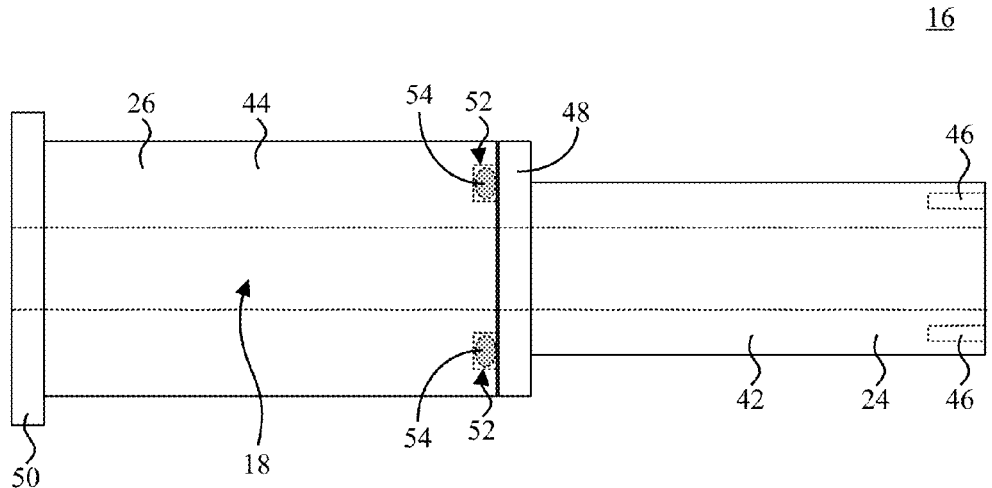
FIG. 5C shows a top view of the armature shown in FIG. 5A.
Figure 5D:
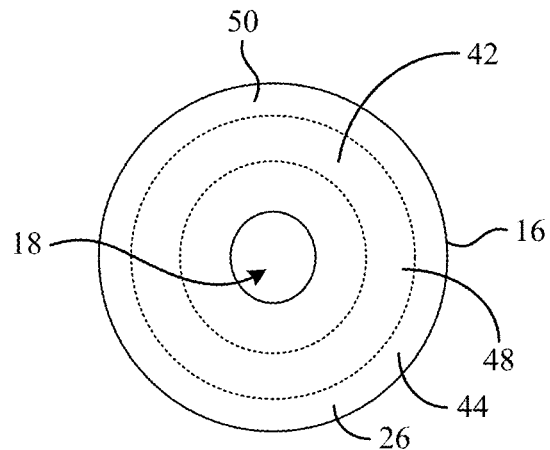
FIG. 5D shows a first end view of the armature shown in FIG. 5A.
Figure 5E:
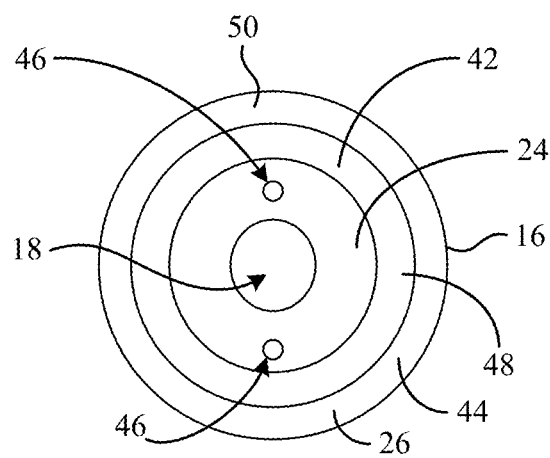
FIG. 5E shows a second end view of the armature shown in FIG. 5A.

According to an embodiment, as shown in FIG. 5A (a side view of armature 16), FIG. 5B (a cross-section of armature 16 shown in FIG. 5A), FIG. 5C (a top view of armature 16 shown in FIG. 5A), FIG. 5D (a first end view of armature 16 shown in FIG. 5A), and FIG. 5E (a second end view of armature 16 shown in FIG. 5A), armature 16 includes mount hole 46 disposed in first member 42 at first end 24. First member 42 includes flange 48 to couple to second member 44 of armature 16. Second member 44 includes flange 50 at second end 26 and gland 52 to receive seal 54 (e.g., an O-ring). First member 42 can be attached to second member 44 with a fastener, e.g., a screw, bolt, adhesive, and the like. Further, flange 50 is configured to receive window 28 (not shown in FIG. 5A). Flange 50 can be attached to vacuum chamber 38 (see FIG. 1), e.g., of a microscope. It should be appreciated that FIG. 5D shows first end view of armature 16 from first end 24, and FIG. 5B shows second end view of armature 16 from second end 26.

Figure 5F:
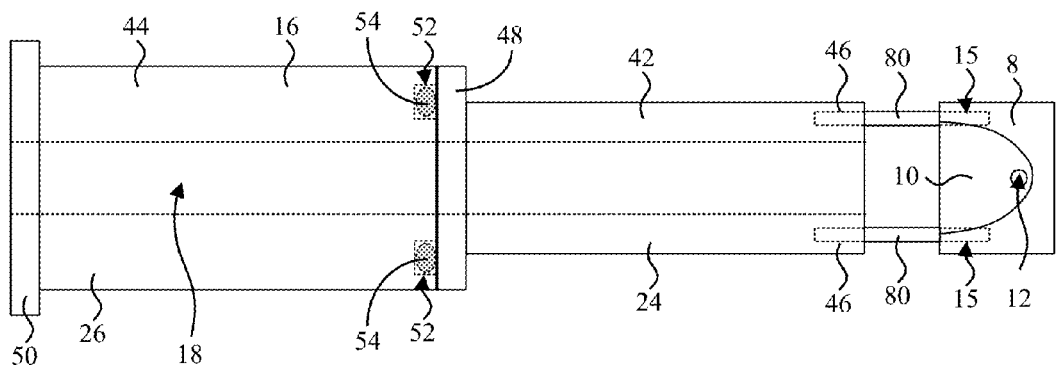
FIG. 5F shows a top view of the armature shown in FIG. 5A, couplers, and parabolic mirror.
Figure 5G:
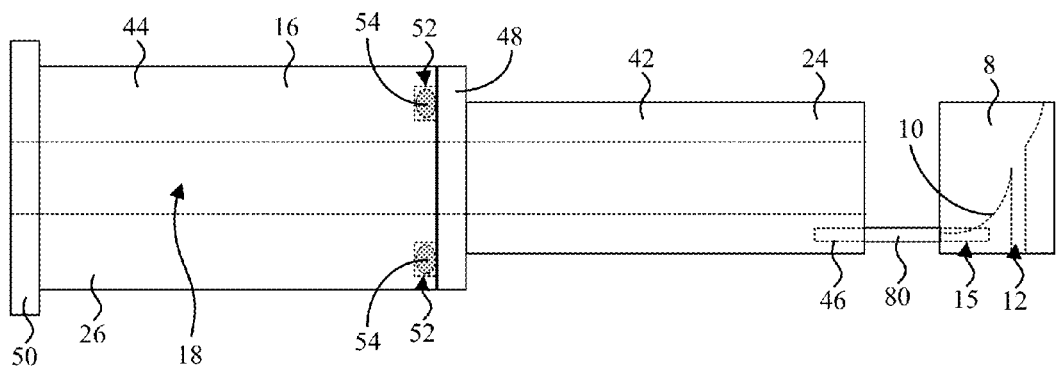
FIG. 5G shows a side view of the armature, couplers, and parabolic mirror shown in FIG. 5F.
Figure 5H:
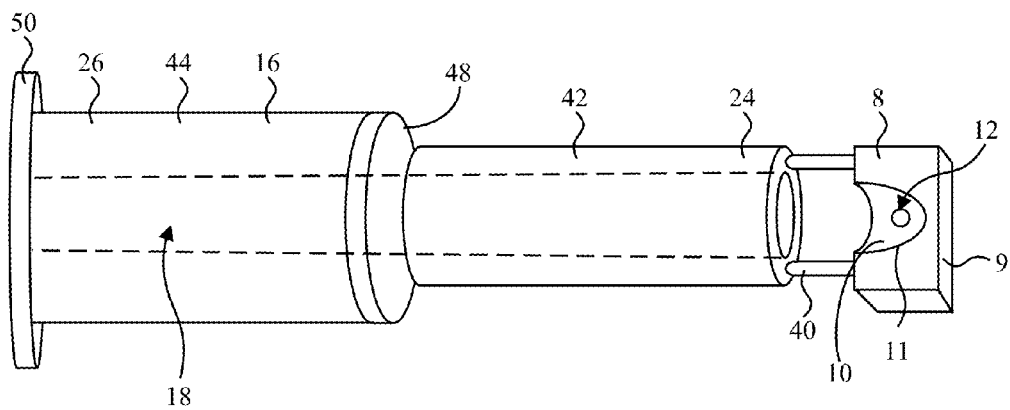
FIG. 5H shows a perspective view of the armature, couplers, and parabolic mirror shown in FIG. 5F.
Figure 5I:
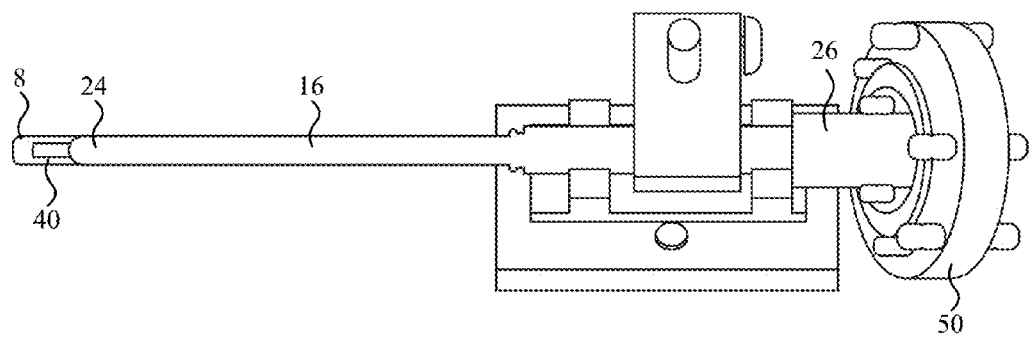
FIG. 5I shows a photograph of a parabolic mirror, couplers, and armature.
Figure 5J:
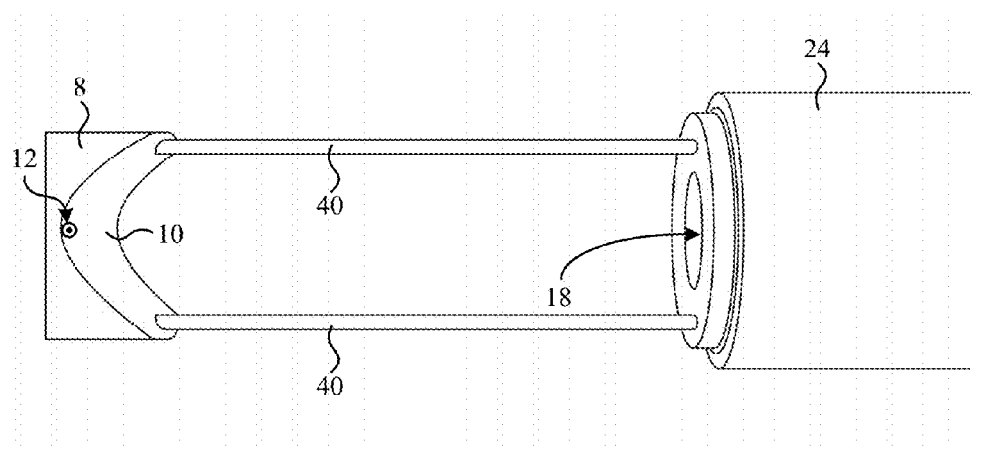
FIG. 5J shows an enlarged portion of the photograph parabolic mirror, couplers, and first end of the armature shown in FIG. 5I.
Figure 5K:
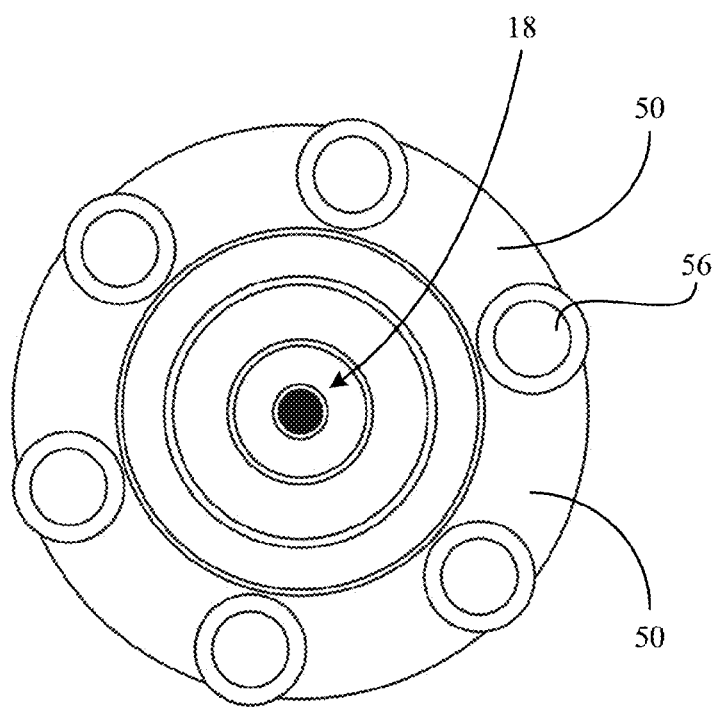
FIG. 5K shows a photograph of a window disposed on the armature shown in FIG. 5I.

In an embodiment, as shown in FIG. 5F (a top view of armature 16 shown in FIG. 5A, couplers 40, and parabolic mirror 8), FIG. 5G (a side view of armature 16, couplers 40, and parabolic mirror 8 shown in FIG. 5F), and FIG. 5H (a perspective view of armature 16, couplers 40, and parabolic mirror 8 shown in FIG. 5F), parabolic mirror 8 is disposed on first end 24 of armature 16 via coupler 40. Additionally, an embodiment of parabolic mirror 8 disposed on armature 16 by coupler 40 is shown in FIG. 5I, and FIG. 5J shows an enlarged portion of the photograph of the parabolic mirror 8, and couplers 40 at first end 24 of armature 16. FIG. 5K shows a photograph of window 28 disposed on flange 50 at second end 26 of armature 16 shown in FIG. 5I. Here, fastener 56 (e.g., a bolt) attach flange 50 to vacuum chamber 38. Also, at second end 26, flange 50 includes a sealing surface that has a knife edge (e.g., a conflate flange) to engagingly compress a seal (e.g., a gasket that can include an elastomer or metal, e.g., a copper gasket) in combination a mating flange on vacuum chamber 38.

Figure 6A:
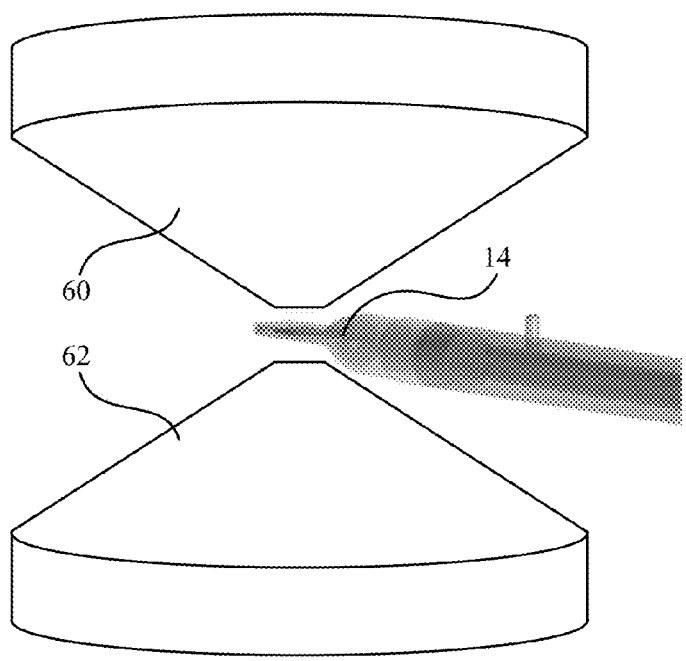
FIG. 6A shows a perspective view of a sample holder and pole pieces.
Figure 6B:
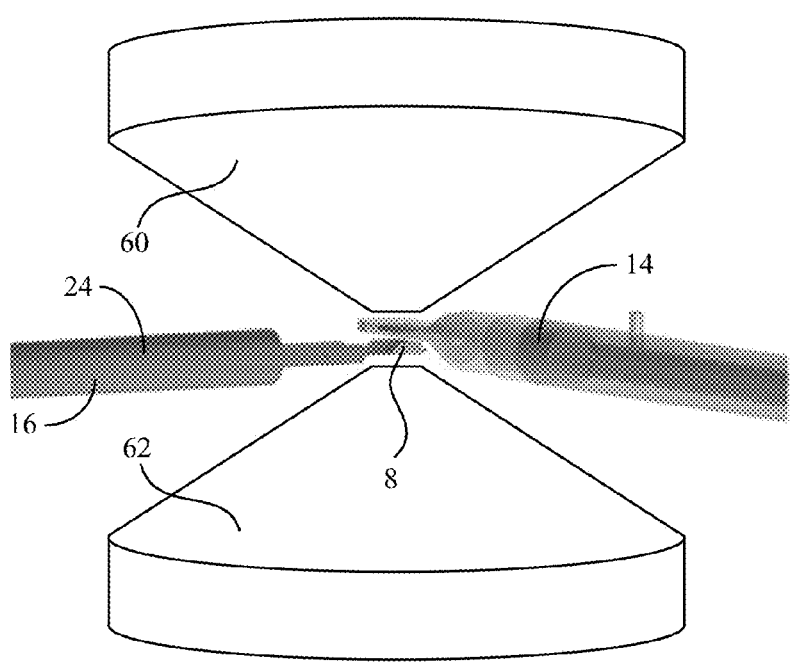
FIG. 6B shows a perspective view of the sample holder and pole pieces shown in FIG. 6A and also a parabolic mirror and armature.
Figure 6C:
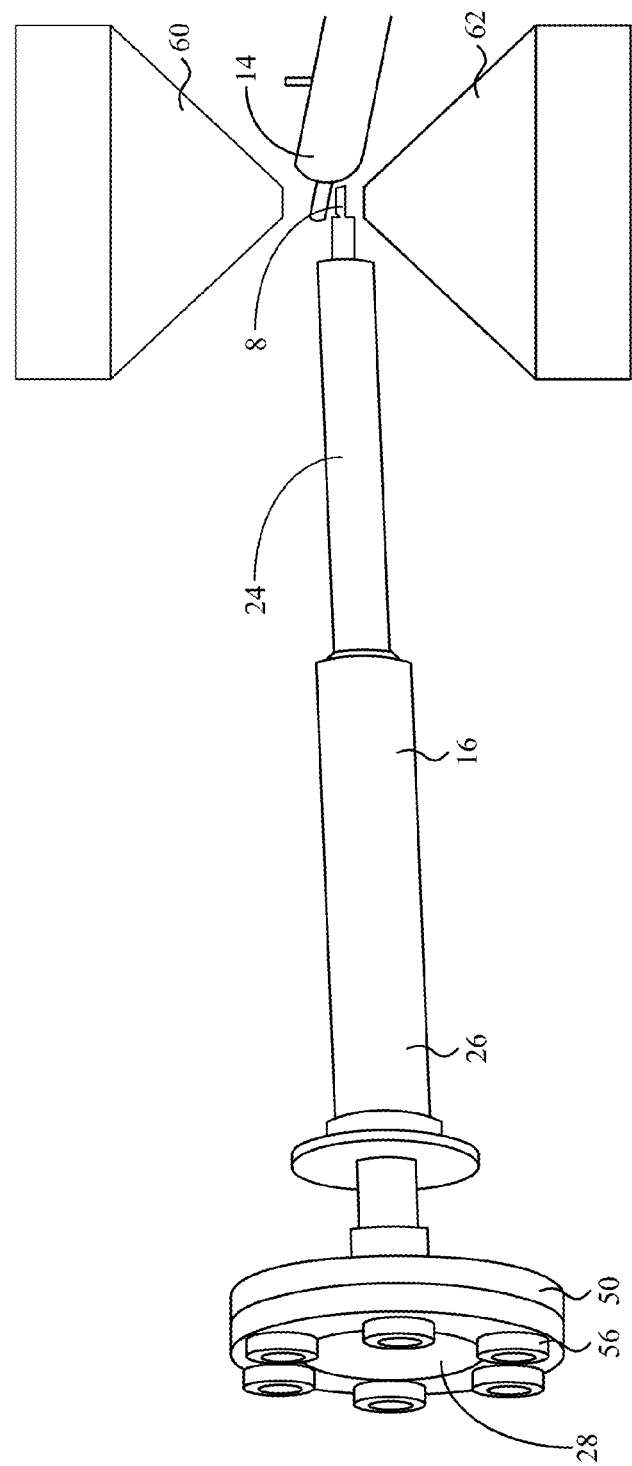
FIG. 6C shows a perspective view of the sample holder, pole pieces, parabolic mirror, and armature shown in FIG. 6B and a window.
Figure 7A:
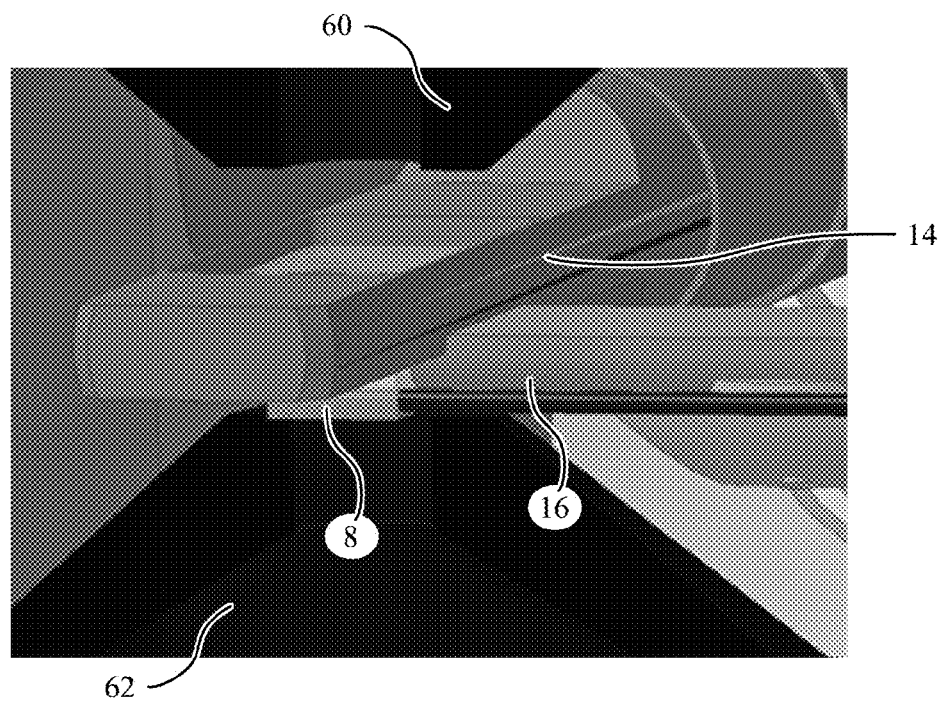
FIG. 7A shows an exploded perspective view of the sample holder, pole pieces, and parabolic mirror shown in FIG. 6B with the sample holder interposed between a first pole piece and the parabolic mirror.
Figure 7B:
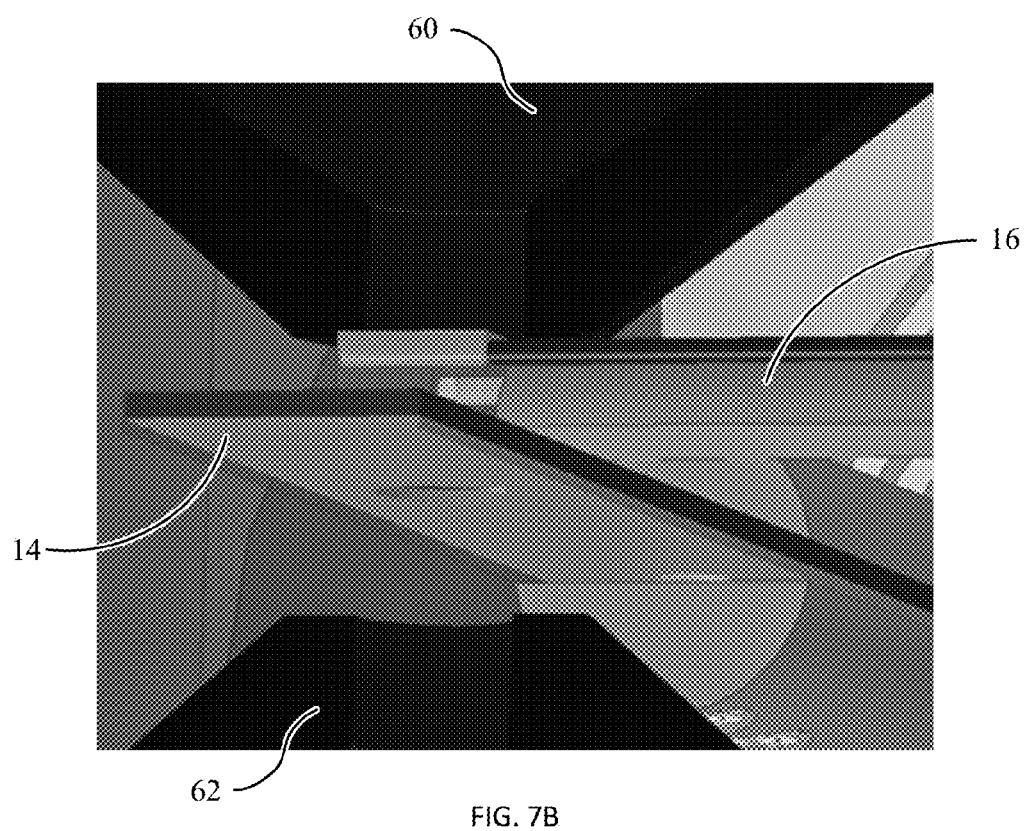
FIG. 7B shows an exploded perspective view of the sample holder, pole pieces, and parabolic mirror shown in FIG. 6B with the parabolic mirror interposed between the sample holder and a first pole piece.
Figure 7C:
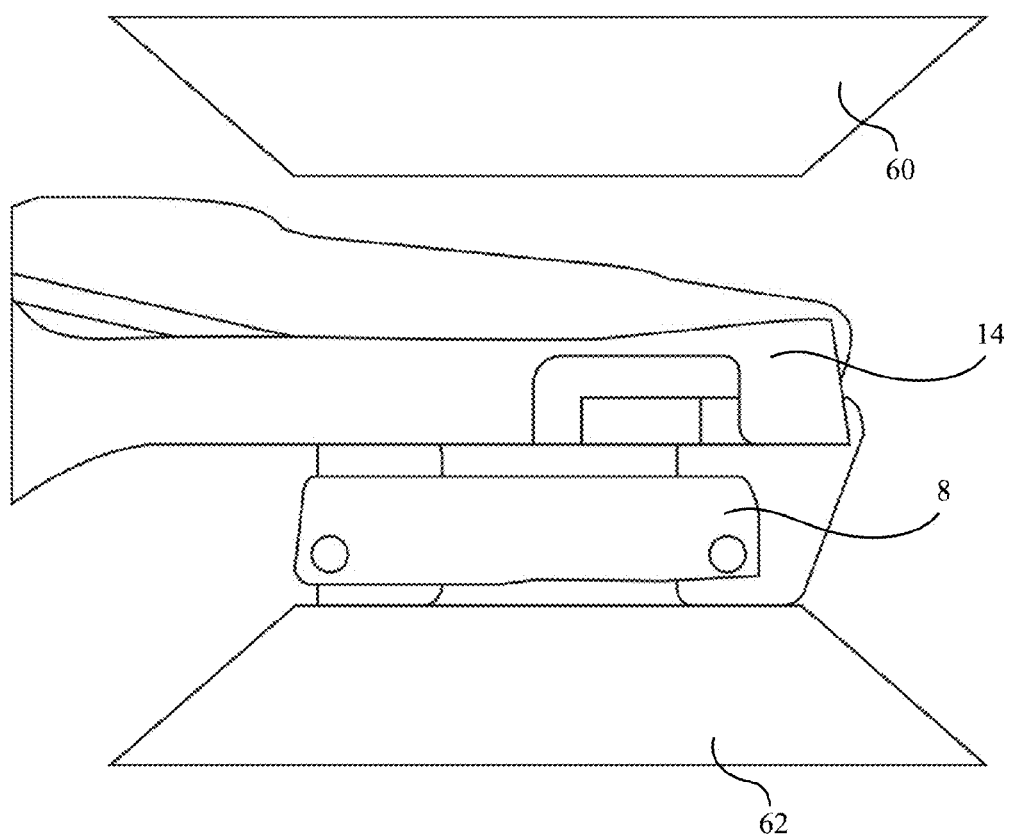
FIG. 7C shows an photograph of a sample holder, pole pieces, and parabolic mirror with the sample holder interposed between a first pole piece and the parabolic mirror.

According to an embodiment, as shown in FIG. 6A (a perspective view of sample holder 14 and pole pieces (60, 62), FIG. 6B (a perspective view of sample holder 14 and pole pieces (60, 62) shown in FIG. 6A and also parabolic mirror 8 and armature 16), and FIG. 6C (a perspective view of sample holder 14, pole pieces (60, 62), parabolic mirror 8, and armature 16 shown in FIG. 6B and window 28), hybrid electron microscope 2 includes sample holder 14 disposed between first pole piece 60 and second pole piece 62 of an electron microscope, parabolic mirror 8 interposed between sample holder 14 and second pole piece 62, and armature 16 attached to and extending from parabolic mirror 8 flange 50, wherein window 28 terminates armature 16. Here, electron source 4 can be included to provide electron beam 6, wherein electron source 4 can be disposed proximate to second pole piece 62 and distal to first pole piece 60. In some embodiments, electron source 4 is disposed proximate to first pole piece 60 and distal to second pole piece 62. Further, FIG. 7A shows an exploded perspective view of sample holder 14 and parabolic mirror 8 disposed on armature 16, wherein sample holder 14 is interposed between first pole piece 60 and parabolic mirror 8. FIG. 7B shows an exploded perspective view of sample holder 8, pole pieces (60, 62), and parabolic mirror 8 shown in FIG. 6B with parabolic mirror 8 interposed between sample holder 14 and first pole piece 60. With reference to a photograph of an embodiment shown in FIG. 7C, sample holder 8, pole pieces (60, 62), and parabolic mirror 8 are arranged such that sample holder 14 is interposed between first pole piece 60 and parabolic mirror 8.

Figure 8A:
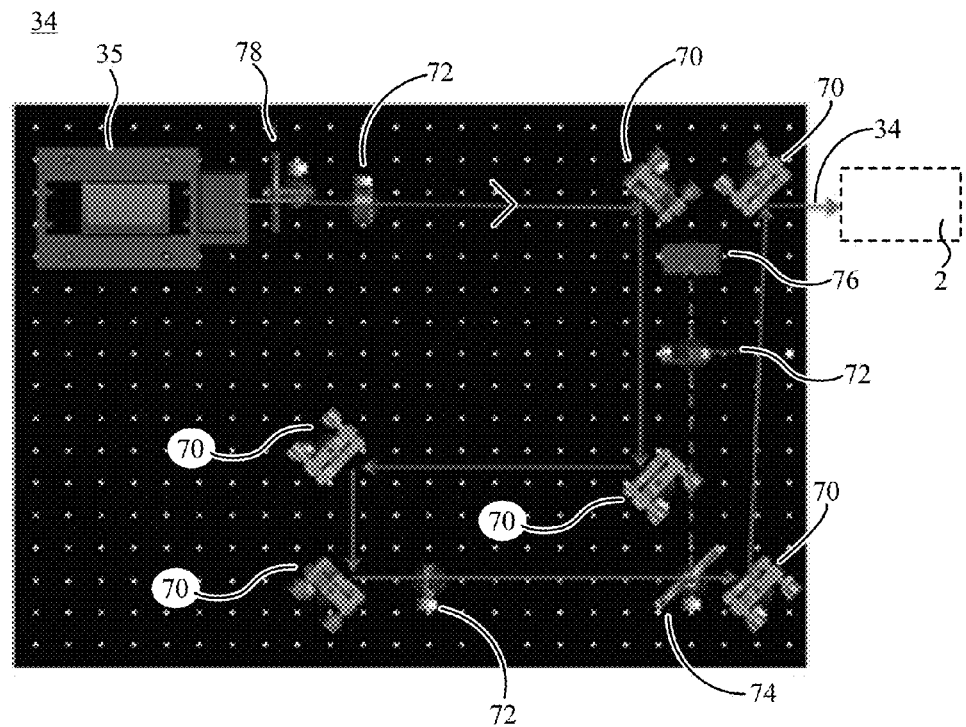
FIG. 8A shows a light source and source optics.

According to an embodiment, as shown in FIG. 8A, hybrid electron microscope 2 is configured to receive probe light 20 from light source 34. Light source 34 can include a laser 35 configured to emit the laser beam that is communicated through lens 72, beam splitter 74, and optic 78 to control the output power of laser 35. Detector 76 can be included to monitor the laser beam from laser 35. The wavelength of laser 35 can be from 190 nanometers (nm) to 1500 nm, e.g., from ultraviolet wavelength to an infrared wavelength.

Figure 8B:
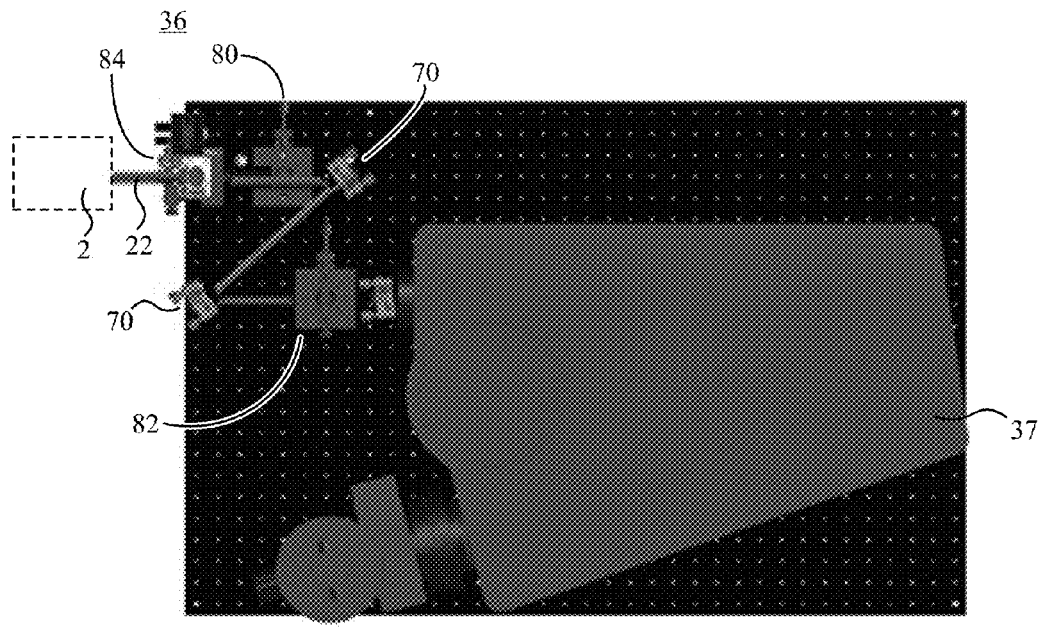
FIG. 8B shows a detector and detection optics.

In an embodiment, as shown in FIG. 8B, hybrid electron microscope 2 is configured to communicate collected light 22 to detector 36. Detector 36 can include optic 84 to reflect selected wavelength and focus it on parabolic mirror 8, optic 80 and optic 70 to collimate collected light 22, optic 82 to focus collected light 22 in to detector 36. Additionally, detector 36 can include spectrograph 37 to acquire collected light 22, e.g., in a wavelength dispersive mode or an imaging mode.

According to an embodiment, parabolic mirror 8 is included to position or focus probe light 20 on to sample 30 disposed on sample holder 14. Parabolic mirror 8 includes substrate 9 and reflective surface 10 disposed thereon. Substrate 9 is a material selected to include reflective surface 10. Reflective surface 10 and substrate 9 can be a same or different material. Reflective surface 10 can be selected to reflect probe light 20 and collected light 22 (from emitted light 32). Exemplary materials for substrate 9 include plastic (e.g., PVC), metal (e.g., aluminum, copper, stainless steel, phosphor bronze, and the like), glass, and the like. Exemplary materials for reflective surface 10 include gold, silver, aluminum, chromium, nickel-chromium alloy, and the like. Substrate 9 can be a non-magnetic, machineable, vacuum compatible solid and reflective surface 10 is based on wavelength of collected light 22.

Figure 9:
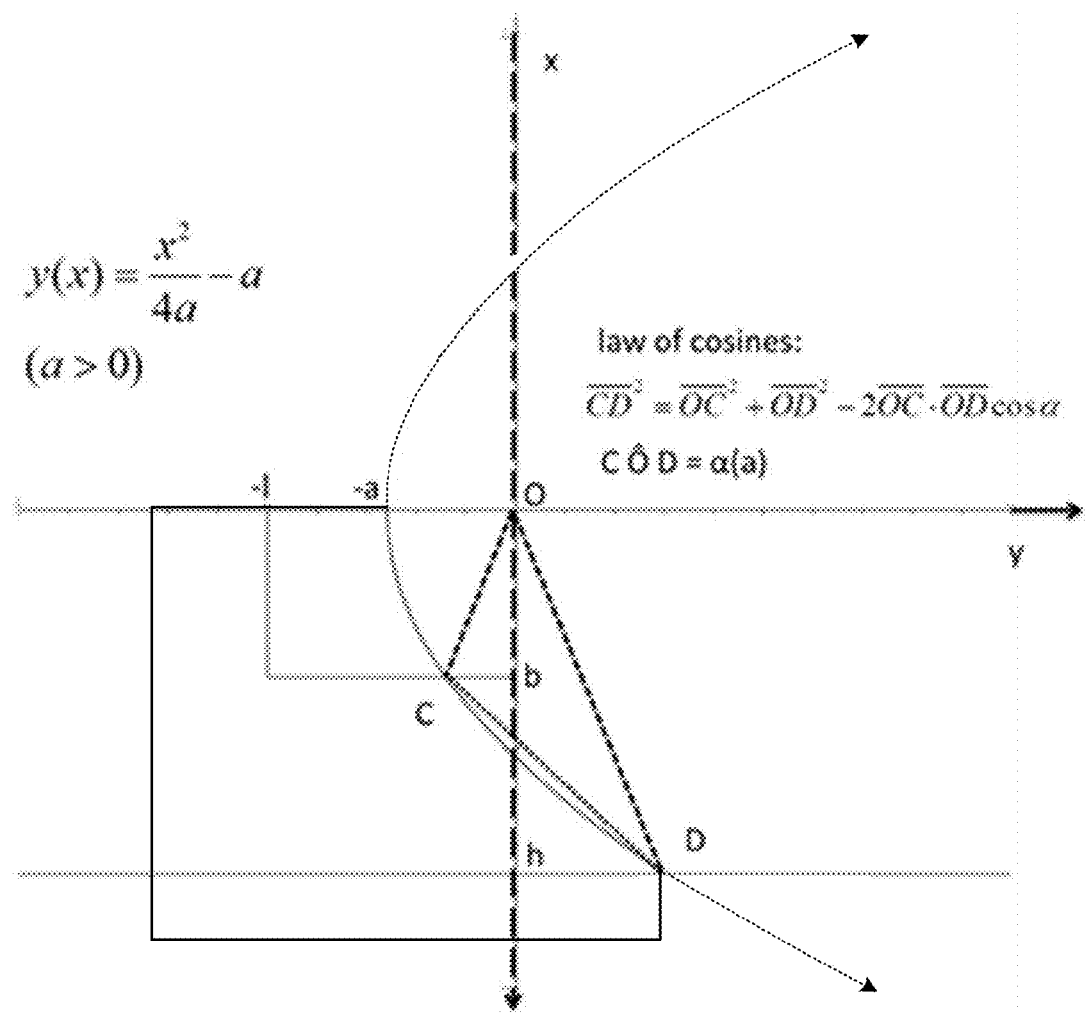
FIG. 9 shows a design for a parabolic mirror.

Reflective surface 10 can be polished and have a selected surface finish. Moreover, with reference to FIG. 9, parabolic mirror 8 can be constructed based on a geometric lens prescription that can involve, e.g., law of cosines and a selected focal point for focusing probe light 20 on sample 30 or focusing collected light 22 from emitted light 32 from sample 30. Moreover, parabolic mirror 8 includes a picture 12 bounded by side wall 13 positioned for communication of electron beam 6.

In an embodiment, a process for making hybrid electron microscope 2 includes disposing electron source 4 to emit electron beam 6 in a chamber 38; disposing parabolic mirror 8 in chamber 38, parabolic mirror 8 including: reflective surface 10 and aperture 12 to communicate electron beam 6 through parabolic mirror 8; and interposing sample holder 14 between electron source 4 and parabolic mirror 8 such that reflective surface 10 of parabolic mirror 8 faces electron source 4 and sample holder 14. The process can further include disposing armature 16 in chamber 38, armature 16 including optical path 18 to communicate probe light 20 to reflective surface 10 and to communicate collected light 22 from reflective surface 10; first end 24 disposed proximate to sample holder 14; second end 26 disposed distal to sample holder 14 and parabolic mirror 8 (disposed on second end 26); optical path 18 extending from first end 24 to second end 26 to communicate probe light 20 and collected light 22; and optical window 28 disposed at first end 24 of armature 16 to receive probe light 20 from light source 34 and to communicate collected light 22 from parabolic mirror 8 to detector 36. In some embodiments, the process also includes disposing sample 30 on sample holder 34 to receive electron beam 6 or probe light 20 and to emit emitted light 32.

In an embodiment, a process for acquiring hybrid electron microscopy data includes disposing parabolic mirror 8 in chamber 38, wherein parabolic mirror includes reflective surface 10 and aperture 12 to communicate electron beam 6 through parabolic mirror 8; disposing sample 30 on sample holder 14; interposing sample holder 14 between electron source 4 and parabolic mirror 8 such that reflective surface 10 of parabolic mirror 8 faces electron source 4 and sample holder 14; producing electron beam 6 from electron source 4; subjecting sample 30 to electron beam 6; communicating electron beam 6 through sample 30 and aperture 12 of parabolic mirror 8; and collecting imaging data of sample 30 in response to subjecting sample 30 to electron beam 6 to acquire the hybrid electron microscopy data. The process can further include: communicating probe light 20 through armature 16 including optical path 18 to reflective surface 10; reflecting probe light 20 from reflective surface 10; receiving, by sample 30, probe light 20 reflected from reflective surface 10; emitting emitted light 32 from sample 30 in response to sample 30 receiving probe light 20 or being subjected to electron beam 6; receiving, by parabolic mirror 8, emitted light 32 from sample 30 to produce collected light 22; and communicating collected light 22 from parabolic mirror 8 through optical path 18 of armature 16. In some embodiments, the process further includes collecting, by detector 36, collected light 22 communicated through armature 16; and acquiring spectroscopic data of sample 30 in response to subjecting sample 30 to probe light 20, wherein the hybrid electron microscopy data includes energy dispersive X-ray analysis (EDXA), electron energy loss spectrometry (EELS), photoluminescence, cathodoluminescence, Raman spectroscopy, or a combination thereof.

Advantageously, hybrid electron microscope 2 is configured to simultaneously acquire: image data of sample 30 during receipt of electron beam 6 from electron source 4; and spectroscopic data of sample 30 during receipt of probe light 20 from parabolic mirror 8. The image data can include electron energy loss spectrometry (EELS), energy-dispersive x-ray spectroscopy (EDS), or a combination thereof. In an embodiment, the image data further include a resolution that is atomic scale resolution. In some embodiments, the spectroscopic data include photoluminescence, Raman spectroscopy, cathodoluminescence or a combination thereof. According to an embodiment, a motion and position of parabolic mirror 8 are independent of sample holder 14. Further, collected light 20 can propagate in optical path 18 of armature 16 and to detector 36 in free space, wherein optical fiber is absent from propagation of probe light 20 from light source 34 and optical path 18 and from propagation of collected 22 in optical path 18 and to detector 36.

Hybrid electron microscope 2 beneficially be included in a variety of electron microscopes. In an embodiment, hybrid electron microscope 2 includes a transmission electron microscope. In a certain embodiment, armature 16 is disposed in an objective aperture port of the transmission electron microscope.

It is contemplated that parabolic mirror 8 can be positioned selectively with respect to sample 30 before or during interaction of sample 30 with electron beam 6. Further, emitted light 32 from sample 30 can be used to obtain cathodoluminescence, photoluminescence, Raman spectroscopy, and the like. In some embodiments, a spot size of probe light 20 on sample 30 is larger than a spot size of electron beam 6 on sample 30. In this manner, dynamical spectroscopic data can be acquired while subjecting sample 32 electron beam 6 to acquire image data in X-ray wavelength of the electromagnetic spectrum or for acquisition of charge particle data such as transmitted or reflected electrons in their energies and angular distribution from sample 30.

The articles and processes herein are illustrated further by the following Examples, which are non-limiting.

EXAMPLES

Example 1

Hybrid Electron Microscope

A free-space, broadband (wavelength $\lambda > 200$ nm), high-efficiency (1.5 sr) hybrid electron microscopy was constructed to be independent of a TEM sample holder and provided multiple types of spectroscopy under reaction conditions. Raman or cathodoluminescence (CL) signals with high signal to noise ratios (SNR) were obtained during ESTEM experiments.

The delivery of light to and collection of light from the sample was accomplished by inserting a parabolic mirror between the sample holder and the lower objective pole piece of the ESTEM. The parabolic mirror was used to focus light onto the sample or collect scattered or emitted photons. Light reached the parabolic mirror along a free-space beam path through a viewport on a hollow rod into the vacuum system. By eliminating any fiber optic components, this arrangement had the advantages that it decoupled the spectrometer mechanically from the microscope (i.e. eliminating a possible source for drift and/or vibrations), the sample holder from the optics, and permitted a wide spectral bandwidth to improve coupling efficiency of light into a spectrometer. Finally, the system handled high continuous-wave and pulsed-laser powers.

A parabolic mirror focused a 532 nm laser onto the sample and collected resulting Raman signal. A space between the pole-pieces and diameter of the port available to insert the parabola were used to determine a design for dimensions of the parabolic mirror with an optimized maximum collection angle. The surface of the parabola had an aluminum coating for a high reflectivity for optical wavelengths (>80% for wavelengths longer than 200 nm and >90% beyond 2000 nm). A 300 μm diameter hole was drilled in the parabola to let the electron beam pass. The position of the hole was aligned with the parabola focal point so that the laser light and electron beam positions coincided on the sample. Thus, the parabolic mirror was arranged in two different configurations: aligned (wherein the Raman probed area of the sample included the ESTEM observation area) or misaligned (wherein Raman and TEM probed distinct areas of the sample). The laser spot on the sample surface was round with a diameter of (11±4) μm (see, e.g., FIG. 21). The probed area was (100±60) μm².

The probed area provided simultaneous collection of micro-scale spectroscopy data and nanoscale ESTEM imaging to complement atomic scale information with large-scale picture of the structure and kinetics in a single in situ measurement. The mirror was connected to a hollow rod by two tungsten wires. This rod-mirror assembly replaced the objective aperture holder. The rod was O-ring sealed to the pre-existing column port and had a sapphire optical window to allow the incoming excitation light and outgoing signal to travel to and from the sample with minimum intensity loss.

A spectrometer equipped with a $N_2$ cooled charge-coupled detector was used for spectra collection. Raman data was collected with a 532 nm diode-pumped, solid-state laser and a neutral-density filter wheel for adjustment of the laser power from 0.1 mW to 300 mW. In Raman mode, the laser light passed through a dichroic beam splitter, then through the sapphire window, and was focused on the sample by the parabolic mirror. The backscattered light from the sample passed directly through the dichroic mirror to the spectrometer and was focused on its entrance slit using a set of two mirrors and an adjustable lens.

Example 2

Raman Data Acquisition

Figure 10:
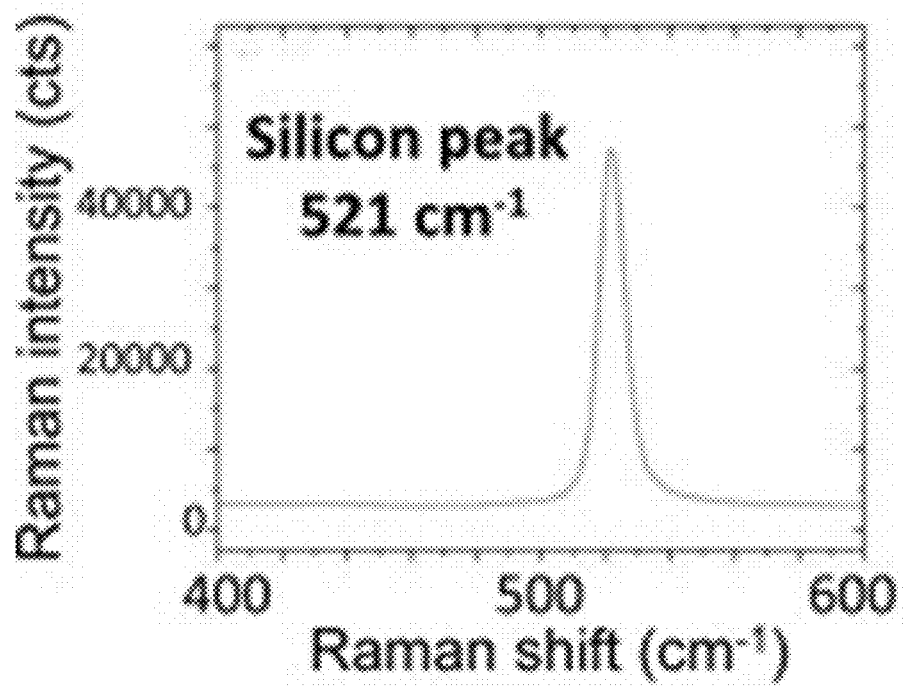
FIG. 10 shows a graph of Raman intensity versus Raman shift.
Figure 11:
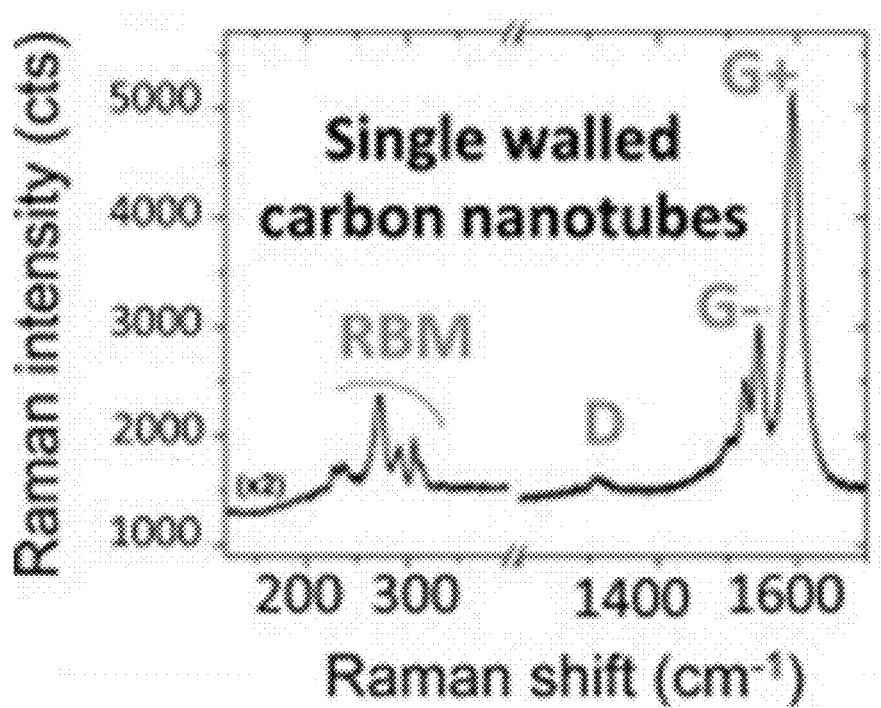
FIG. 11 shows a graph of Raman intensity versus Raman shift.
Figure 12:
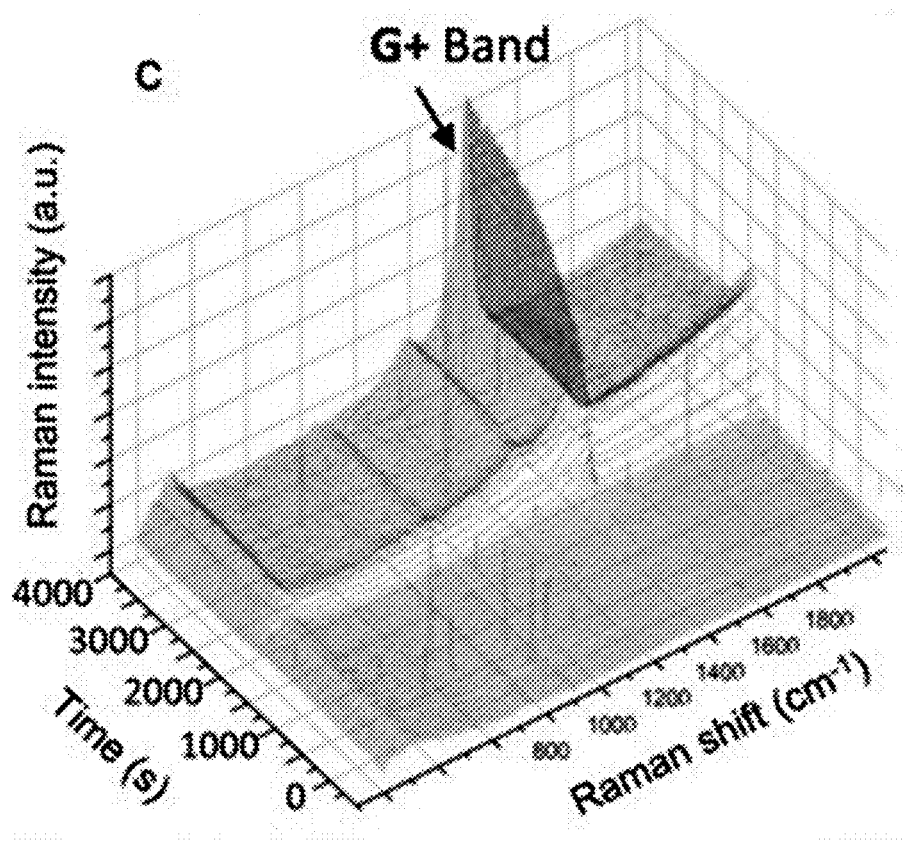
FIG. 12 shows a graph of Raman intensity versus time and Raman shift.
Figure 13:
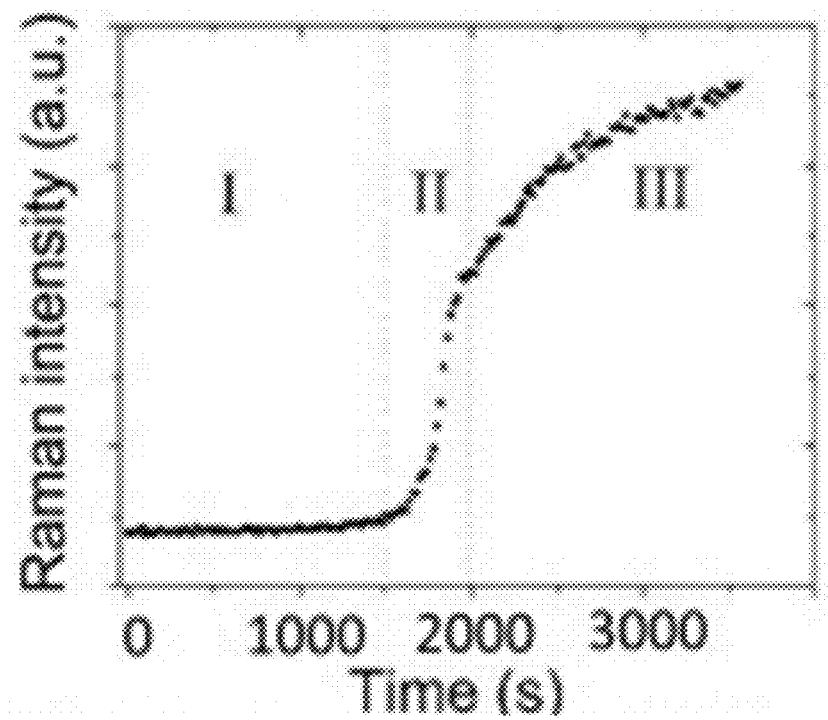
FIG. 13 shows a graph of Raman intensity versus time.
Figure 14:
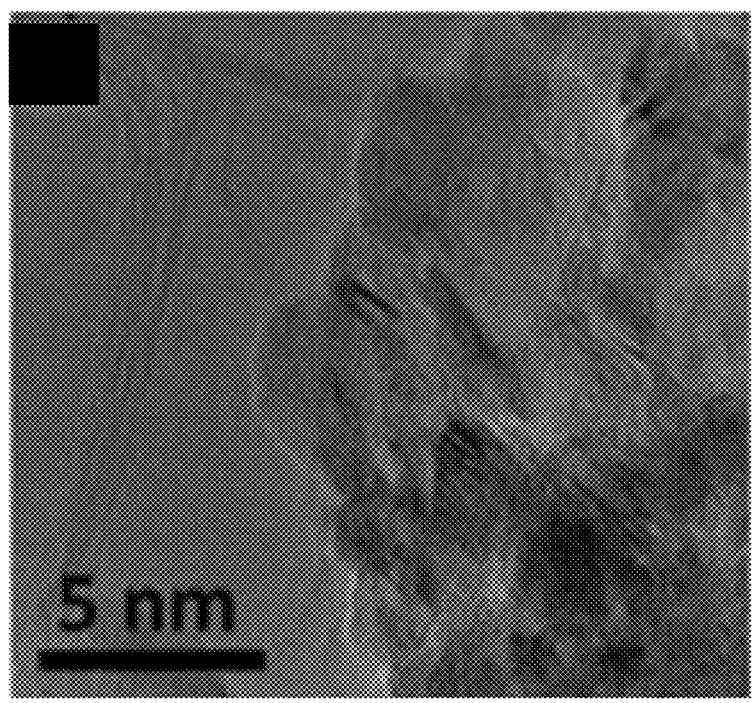
FIG. 14 shows an electron micrograph of a sample.

In situ calibration of the Raman spectrometer was done using the silicon peak at 521 cm$^{-1}$ from the silicon area surrounding a MEMS heating device (FIG. 10). FIG. 11 shows a 30 s acquisition time room-temperature Raman spectrum obtained from single-wall carbon nanotubes (SW-CNT) after their growth in the ESTEM at 625° C. under acetylene flow using a Co/MgO catalyst/support. It exhibited typical Raman features of SWCNTs: radial breathing modes (RBM), D band, G bands (G– and G+) at ≈300 cm$^{-1}$, 1300 cm$^{-1}$ and ≈1600 cm$^{-1}$. Shapes and positions of these peaks provided structural information about the nanotubes such as diameter distribution, global defect density, and chirality (e.g. semiconducting/metallic). Moreover, the high efficiency of the signal collection (1.5 sr) provided temporal evolution of the G band (the most prominent feature of SWCNT spectra) intensity during the growth, in spite of the peak broadening and weakening that occurred with increasing temperature (FIG. 12 and FIG. 13). Spectra with 20 s acquisition times were recorded during a 60 min growth period. Continuous Raman acquisition provided an estimate for temporal evolution of nanotubes and extraction of reaction kinetics while atomic resolution movies were recorded simultaneously. The observed growth period was divided as follows (I) an incubation period of 1500 s during which only a very weak signal from G band was observed, (II) an acceleration of the growth between 1500 s and 2000 s, and (III) deceleration of the growth after 2000 s. Existence of these three growth regimes for long SWCNTs was evidenced with optical spectroscopy. FIG. 14 shows an ESTEM image after 1700 s of growth. Raman data showed a steady but slow increase of the G+ peak. High resolution imaging provided identification of elementary processes and phenomena to explain existence of these different growth regimes. At high temperature, the spectra acquisition can include effects from black body emission from the incandescent specimen. For 532 nm laser light here, this effect was present at 600° C. (see FIG. 26).

Example 3

Temperature Measurement

Frequencies of Raman peaks can downshift with increasing temperature because of softening of interatomic bonds, making measurement of peak shifts a parameter for temperature determination. SWCNTs can be used for such measurement. A solution of dispersed SWCNTs was deposited on a MEMS heating device and the temperature was derived from the relation between the G+ band position, $\upsilon_{G+}$, and the temperature: $d(\upsilon_{G+})/dT=(0.0275\pm0.0013)$ cm$^{-1}$ K$^{-1}$ (5% relative error, i.e., ±38° C. at 500° C.). The presented uncertainty corresponds to the single standard deviation from the averaged $d(\upsilon_{G+})/dT$ value. Relative temperature variations provided determination of Raman peak position shifts. Spatial resolution for temperature measurements corresponds to the laser beam spot size that is (11±4) µm.

Figure 15:
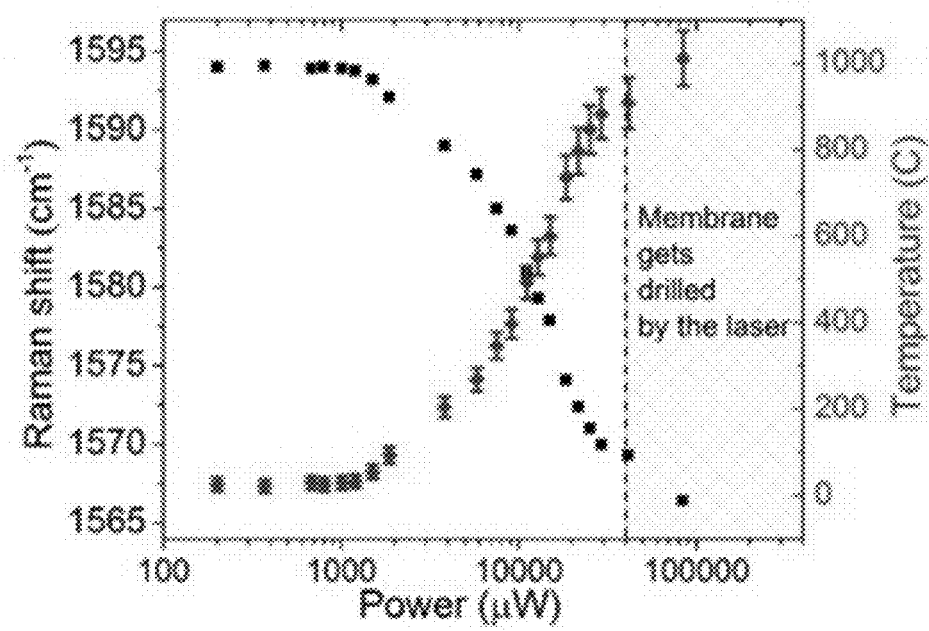
FIG. 15 shows a graph of Raman shift and temperature versus power.

Such measurements provided evaluation of sample heating by laser power. Thin membranes can be used in temperature determination of the sample holder and are used as sample support in a MEMS heating device. FIG. 15 shows the 532 nm laser had negligible sample heating below a threshold of 1.2 mW, where no temperature increase was observed. No Raman peak shift was observed. Raman measurements were performed at 800 µW. Heating was observed as the power increased above the threshold: a maximum of 880° C. temperature was reached at a power of 29.1 mW. Above this power, laser heating melted the membrane and drilled holes. Heating of the MEMS device was reproducible from one device to others so that the laser was used as a controlled local heating source.

Figure 16:
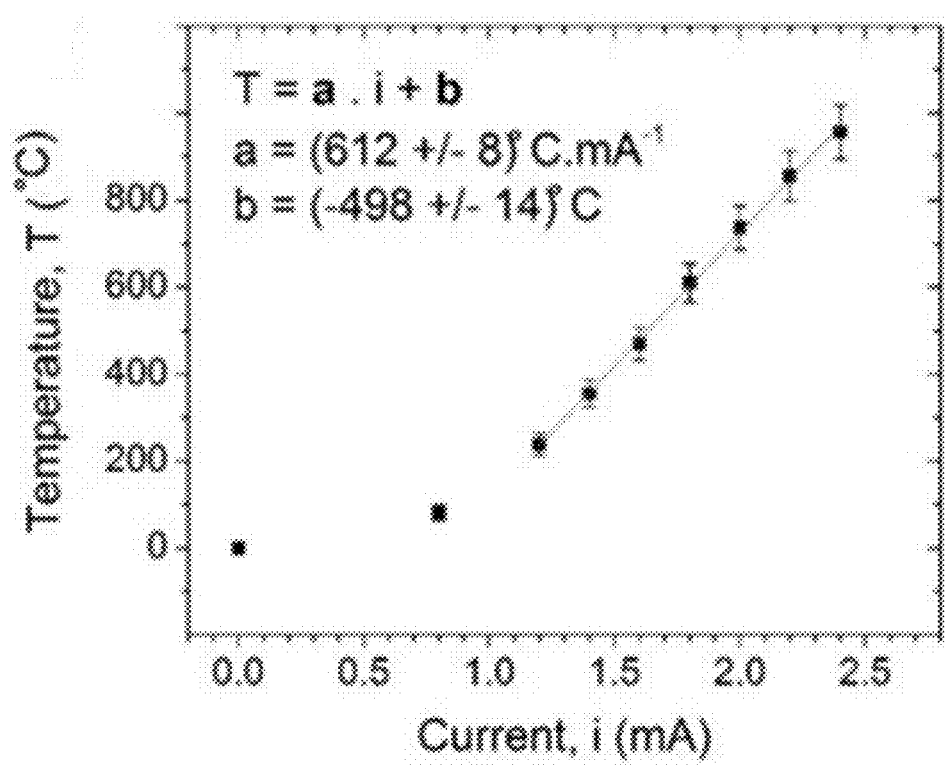
FIG. 16 shows a graph of temperature versus current.
Figure 17:
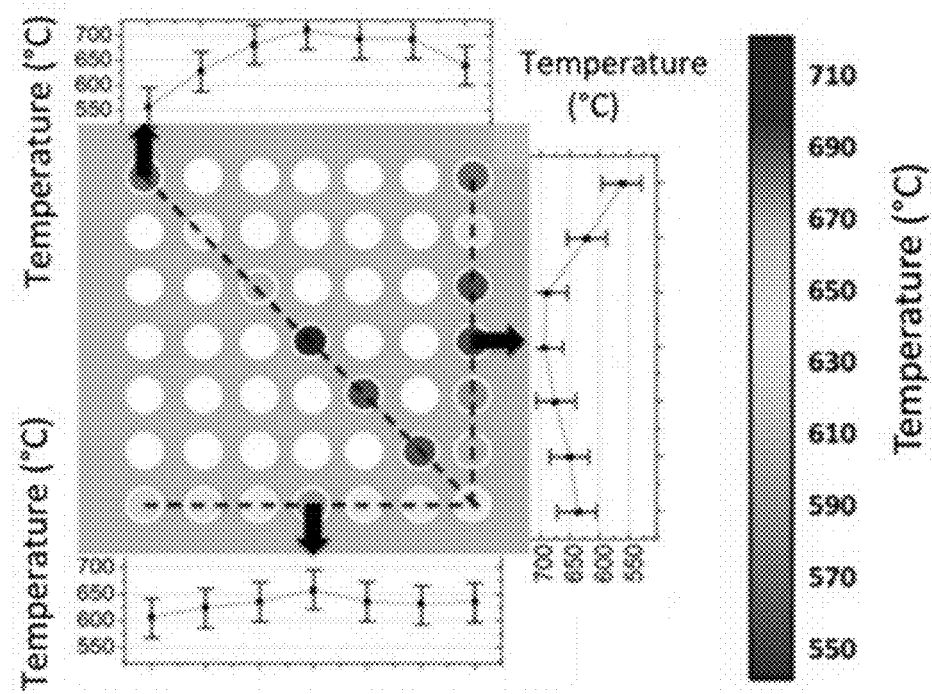
FIG. 17 shows a portion of a sample holder and graphs of temperature versus position for the sample holder.

FIG. 16 shows a calibration of the MEMS heating device. Here, the temperature linearly increased with applied current in the 200-900° C. range. FIG. 17 shows strong temperature gradients on membrane heaters were present; the data were obtained by measuring the nanotube Raman G+ peak position on each membrane hole.

Figure 18:
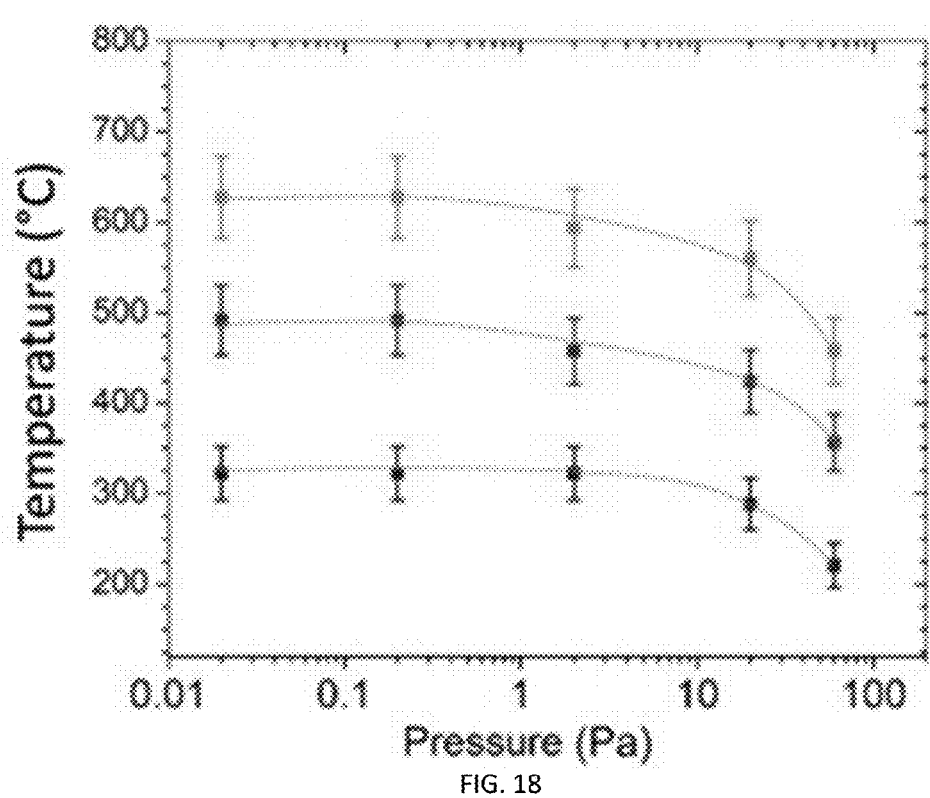
FIG. 18 shows a graph of temperature versus pressure.

During ESTEM temperature decreased when a room-temperature gas was introduced. FIG. 18 shows temperature drop after introduction of nitrogen. At a pressure of 2 Pa of nitrogen, the temperature dropped from 630° C. to 595° C., from 490° C. to 460° C., and no drop was observed at 320° C. For a pressure of 60 Pa, the temperature drop was found to be greater in magnitude: from 630° C. to 460° C., from 490° C. to 360° C. and from 320° C. to 220° C.

Example 4

Cathodoluminescence (CL) Data Acquisition

Figure 19:
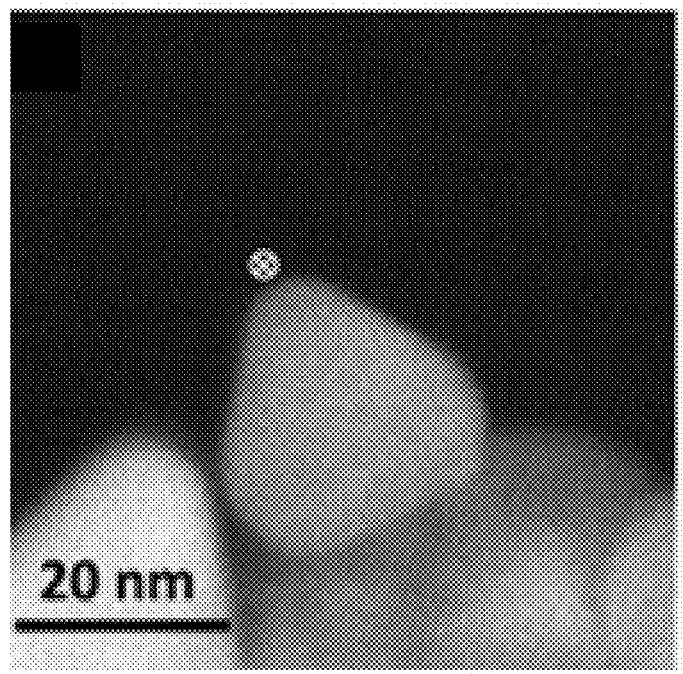
FIG. 19 shows an electron micrograph of a sample.
Figure 20:
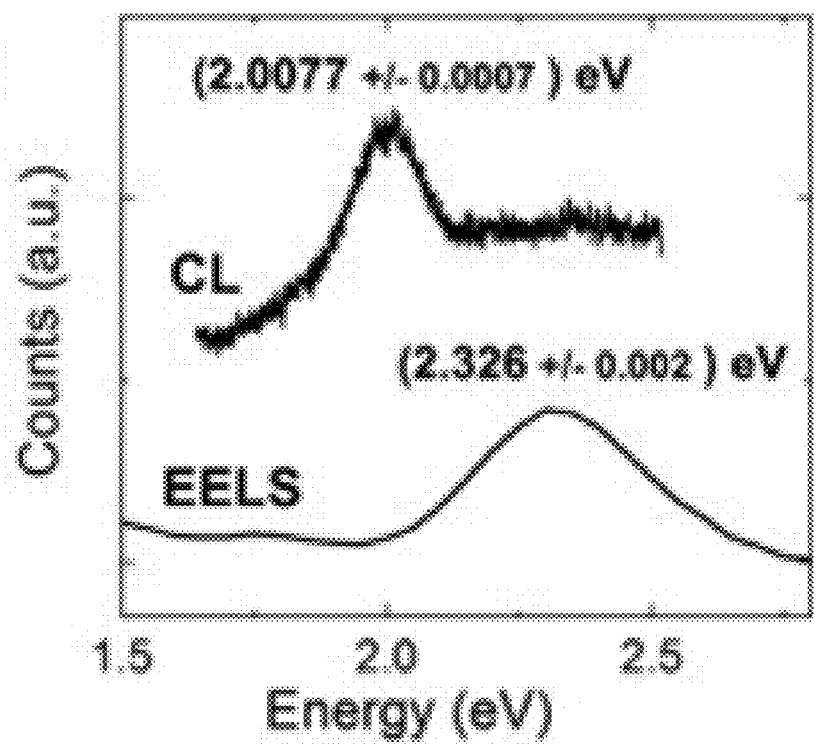
FIG. 20 shows a graph of counts versus energy.

The parabolic mirror was used to collect photon emitted by a sample as a result of electron excitation. CL in an electron microscope provided optical and structural characterization with high spatial resolution. Concurrent collection of CL and electron energy loss spectroscopy (EELS) along with STEM imaging from a nanometer region of a gold nanoparticle was obtained as shown in FIG. 19 and FIG. 20. The CL spectral resolution was less than 1 meV compared to the 100 meV resolution of monochromated EELS. While the EELS signal resulted from an absorption phenomenon, CL was an emission process. Correlating both techniques at the same time and from the same area provided determination of local optical properties of the sample. The CL data obtained from nano-scale areas was compared with photoluminescence generated from micrometer scale areas via laser irradiation to provide local and global information at the same time.

Example 5

Laser Beam Spot Size and Shape

Figure 21:
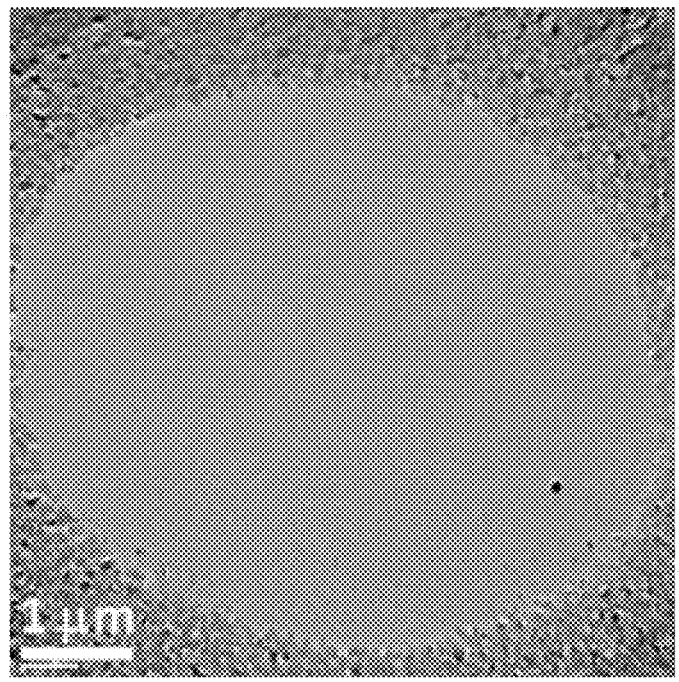
FIG. 21 shows an electron micrograph of a parabolic mirror.
Figure 22:
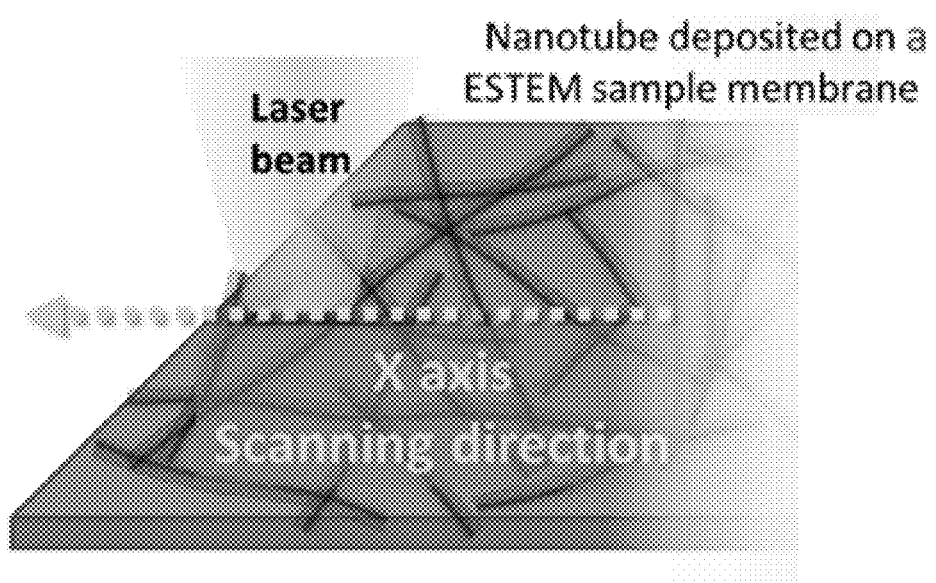
FIG. 22 shows a sample and probe light.
Figure 23:
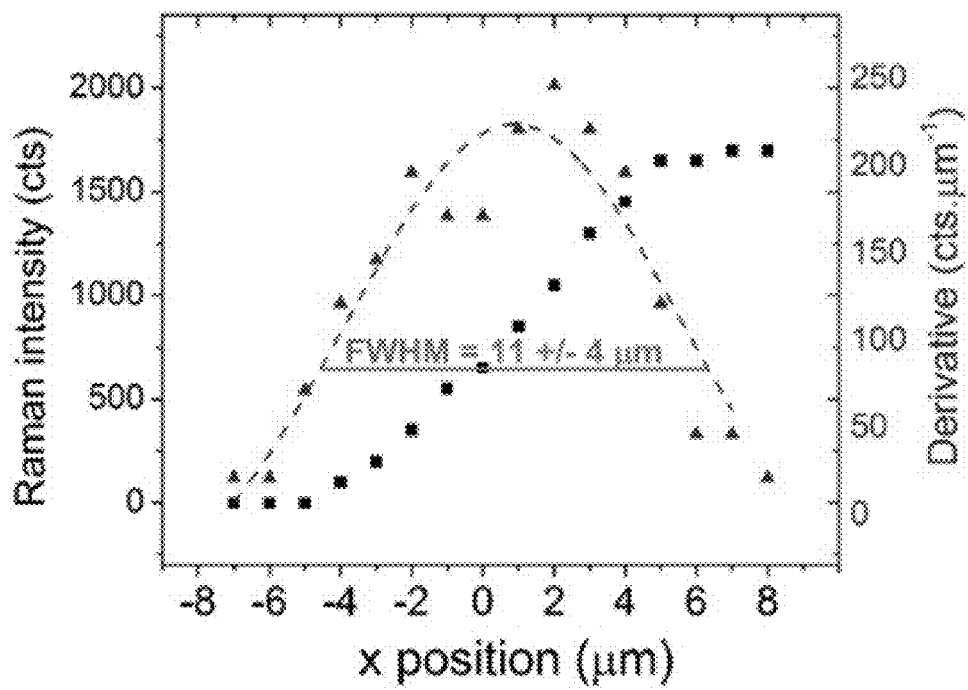
FIG. 23 shows a graph of Raman intensity and derivative versus position.

FIG. 21 shows a transmission electron microscope image of a hole drilled in the sample membrane by the 532 nm laser at 200 mW, showing that the laser beam has a round shape. FIG. 22 shows an x-axis laser scan direction to collect Raman signal from nanotubes deposited on a TEM grid, and FIG. 23 provides nanotube Raman signal decay across the edge of a sample covered by nanotube shown in black. The derivative of the Raman intensity as a function of the x position, shown in grey, gives the Gaussian profile of the laser beam. The beam size was obtained by measuring the full half width maximum (FWHM) of the corresponding fitted curve (red dashed line). A (11±4) µm laser beam spot size was obtained.

Example 6

Temperature Measurement

A temperature of the TEM sample was determined by measuring the G band peak position of carbon nanotubes (CNTs) deposited on the sample. The measured intrinsic temperature of CNTs provided an estimation of the actual sample temperature.

Figure 24:
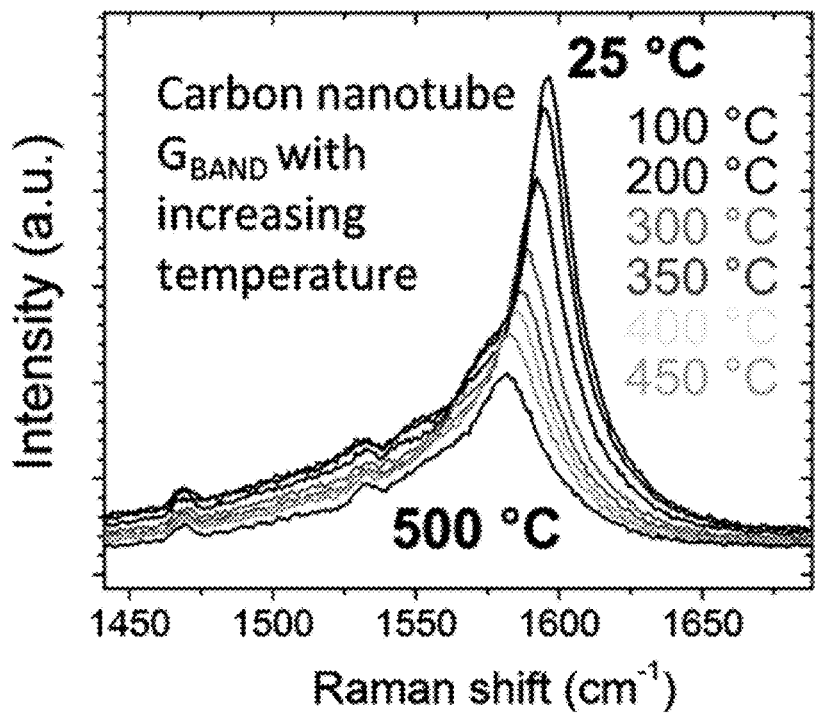
FIG. 24 shows a graph of intensity versus Raman shift.
Figure 25:
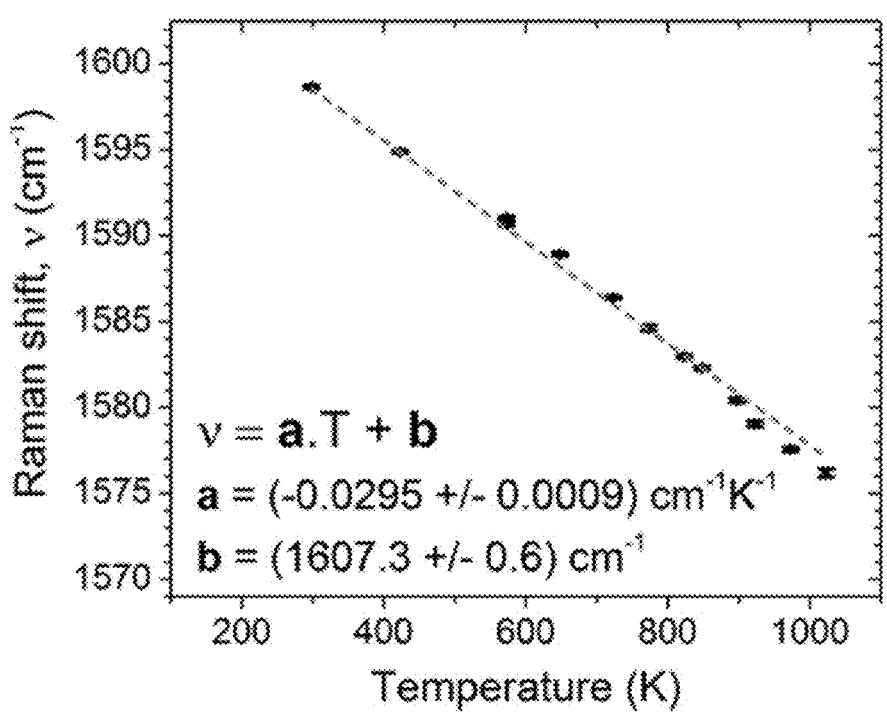
FIG. 25 shows a graph of Raman shift versus temperature.

The G+Raman frequency downshifts with temperature due to the softening of the in-plane C—C bond, whose vibrations were along the nanotube axis so their frequency was essentially independent of the nanotubes diameter. The G+ peak was sharp and ensured a position measurement precision. The sample provided a determination of the temperature of micron scale region of the heating devices. The temperature dependence of G+ frequency was approximately equal to the corresponding one of graphite G band, that was $dv/dT=-0.027$ $cm^{-1}K^{-1}$. This temperature dependence agreed with the value that was previously obtained in a furnace equipped with a thermocouple: $(0.0295\pm0.0009)$ $cm^{-1}K^{-1}$ at 514 nm from catalytic chemical SWCNTs. The average value of $dv/dT=(0.0275\pm0.0013)$ $cm^{-1}K^{-1}$ was used. FIG. 24 shows a change of the G band of single walled carbon nanotubes with increasing temperature, and FIG. 25 shows a change of the G+ band Raman frequency with increasing temperature.

Example 7

Raman Spectra Acquisition at High Temperature

Figure 26:
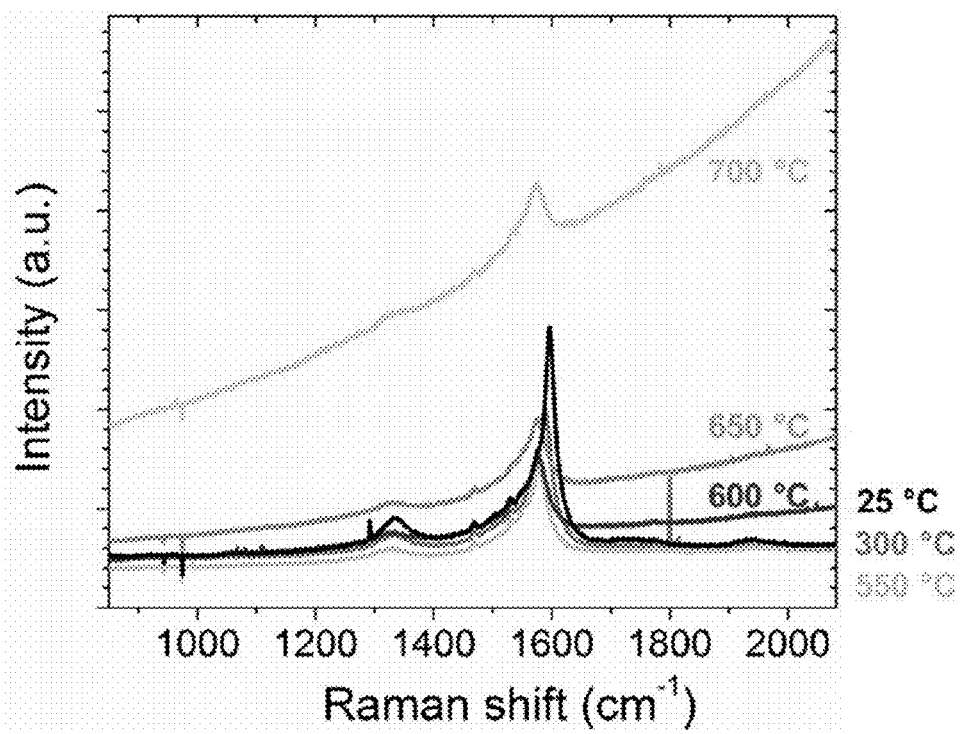
FIG. 26 shows a graph of intensity versus Raman shift.

For 532 nm laser light, incandescence of the sample started to be visible at 600° C. This effect is greater for longer wavelength lasers (red and infra-red). FIG. 26 shows changes of the G band of single walled carbon nanotubes with increasing temperature and present appearance of black body emission continuous background at 600° C., at 532 nm.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A hybrid electron microscope comprising:
   an electron source to emit an electron beam;
   a parabolic mirror comprising;
      a reflective surface; and
      an aperture to communicate the electron beam through the parabolic mirror;
   a sample holder interposed between the electron source and the parabolic mirror such that the reflective surface of the parabolic mirror faces the electron source and the sample holder; and
   an armature comprising an optical path to communicate a probe light to the reflective surface and to communicate a collected light from the reflective surface.

2. The hybrid electron microscope of claim 1, the armature further comprising:
   a first end disposed proximate to the sample holder;
   a second end disposed distal to the sample holder and the parabolic mirror, the parabolic mirror disposed on the first end; and
   an optical path extending from the first end to the second end to communicate the probe light and the collected light.

3. The hybrid electron microscope of claim 2, further comprising an optical window disposed at the second end of the armature to receive the probe light from a light source and to communicate the collected light from the parabolic mirror to a detector.

4. The hybrid electron microscope of claim 3, further comprising a detector to detect the collected light.

5. The hybrid electron microscope of claim 4, further comprising a sample disposed on the sample holder:
   to receive the electron beam from the electron source;
   to receive the probe light from the parabolic mirror;
   to emit an emitted light in response to receipt of the electron beam, the probe light, or a combination comprising at least one of the foregoing.

6. The hybrid electron microscope of claim 5, wherein the hybrid electron microscope is configured to simultaneously acquire:
  image data of the sample during receipt of the electron beam from the electron source; and
  spectroscopic data of the sample during receipt of the probe light from the parabolic mirror.

7. The hybrid electron microscope of claim 6, wherein the image data comprise electron energy loss spectrometry (EELS), energy-dispersive x-ray spectroscopy (EDS), or a combination comprising at least one of the foregoing.

8. The hybrid electron microscope of claim 7, wherein the image data further comprise a resolution that is atomic scale resolution.

9. The hybrid electron microscope of claim 6, wherein the spectroscopic data comprise photoluminescence, Raman spectroscopy, cathodoluminescence or a combination comprising at least one of the foregoing.

10. The hybrid electron microscope of claim 6, wherein a motion and position of the parabolic mirror are independent of the sample holder.

11. The hybrid electron microscope of claim 4, wherein the collected light propagates in the optical path of the armature and to the detector in free space.

12. The hybrid electron microscope of claim 1, wherein the hybrid electron microscope further comprises a transmission electron microscope.

13. The hybrid electron microscope of claim 12, wherein the armature is disposed in an objective lens port of the transmission electron microscope.

14. A process for making a hybrid electron microscope, the process comprising:
  disprosing an electron source to emit an electron beam in a chamber;
  disposing a parabolic mirror in the chamber, the parabolic mirror comprising:
    a reflective surface; and
    an aperture to communicate the electron beam through the parabolic mirror;
  interposing a sample holder between the electron source and the parabolic mirror such that the reflective surface of the parabolic mirror faces the electron source and the sample holder; and
  disposing an armature in the chamber, the armature comprising:
    an optical path to communicate a probe light to the reflective surface and to communicate a collected light from the reflective surface;
    a first end disposed proximate to the sample holder;
    a second end disposed distal to the sample holder and the parabolic mirror, the parabolic mirror disposed on the second end;
    an optical path extending from the first end to the second end to communicate the probe light and the collected light; and
    an optical window disposed at the first end of the armature to receive the probe light from a light source and to communicate the collected light from the parabolic mirror to a detector.

15. The process of claim 14, further comprising: disposing a sample on the sample holder to receive the electron beam or the probe light and to emit emitted light.

16. A process for acquiring hybrid electron microscopy data, the process comprising:
  disposing a parabolic mirror in a chamber, the parabolic mirror comprising;
    a reflective surface; and
    an aperture to communicate the electron beam through the parabolic mirror;
  disposing a sample on a sample holder;
  interposing a sample holder between the electron source and the parabolic mirror such that the reflective surface of the parabolic mirror faces the electron source and the sample holder; and
  producing the electron beam from the electron source;
  subjecting the sample to the electron beam;
  communication the electron beam through the sample and the aperture of the parabolic mirror;
  collecting imaging data of the sample in response to the subjecting the sample to the electron beam to acquire the hybrid electron microscopy data;
  communicating a probe light through an armature comprising an optical path to the reflective surface;
  reflecting the probe light from the reflective surface;
  receiving, by the sample, the probe light reflected from the reflective surface;
  emitting light from sample in response to the sample receiving the probe light or being subjected to the electron beam;
  receiving, by the parabolic mirror the light emitted from the sample to produce the collected light; and
  communicating the collected light from the parabolic mirror through the optical path of the armature.

17. The process of claim 16, further comprising collecting, by a detector, the collected light communicated through the armature; and
  acquiring spectroscopic data of the sample in response to the subjecting the sample to the probe light,
  wherein the hybrid electron microscopy data comprises energy dispersive X-ray analysis (EDXA), electron energy loss spectrometry (EELS), photoluminescence, cathodoluminescence, Raman spectroscopy, or a combination comprising at least one of the foregoing.

* * * * *